(12) United States Patent
Ranatunga et al.

(10) Patent No.: US 10,075,196 B2
(45) Date of Patent: Sep. 11, 2018

(54) INFORMATION PROCESSING APPARATUS, INFORMATION PROCESSING METHOD, AND PROGRAM

(71) Applicant: SONY CORPORATION, Tokyo (JP)

(72) Inventors: Vijitha Ranatunga, Kanagawa (JP); Shoichi Usui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/906,216

(22) PCT Filed: May 23, 2014

(86) PCT No.: PCT/JP2014/063690
§ 371 (c)(1),
(2) Date: Jan. 19, 2016

(87) PCT Pub. No.: WO2015/015880
PCT Pub. Date: Feb. 5, 2015

(65) Prior Publication Data
US 2016/0164545 A1    Jun. 9, 2016

(30) Foreign Application Priority Data

Jul. 30, 2013    (JP) ................................ 2013-158055

(51) Int. Cl.
*H03M 13/00* (2006.01)
*H04L 1/00* (2006.01)
(52) U.S. Cl.
CPC ........ *H03M 13/616* (2013.01); *H04L 1/0041* (2013.01); *H04L 1/0057* (2013.01)
(58) Field of Classification Search
CPC ... H03M 13/616; H04L 1/0041; H04L 1/0057
See application file for complete search history.

(56) References Cited

U.S. PATENT DOCUMENTS 8,972,815 B1\* 3/2015 Hwee ..................... H03M 13/11
714/746
2007/0277209 A1\* 11/2007 Yousef ............... H04N 21/2381
725/112
(Continued)

FOREIGN PATENT DOCUMENTS

CN     1947369 A     4/2007
JP     7-240749 A    9/1995
(Continued)

OTHER PUBLICATIONS

International Search Report dated Aug. 19, 2014 in PCT/JP2014/063690 filed May 23, 2014.
Extended European Search Report dated Feb. 17, 2017 in patent application No. 14833036.8.
Office Action dated May 31, 2018 in Chinese Application No. 201480041621.2, along with an English translation.
Office Action dated Apr. 3, 2018 in Japanese Application No. 2015-529423, and an English translation.

*Primary Examiner* — Kyle Vallecillo
(74) *Attorney, Agent, or Firm* — Oblon, McClelland, Maier & Neustadt, L.L.P.

(57) ABSTRACT

[Object] To provide a new and improved information processing apparatus, information processing method, and program, capable of improving technology related to FEC for achieving low delay transfer.
[Solution] Provided is an information processing apparatus including: an arrangement unit configured to arrange datagrams in a number of a predetermined matrix size or less in at least a portion of the matrix of the predetermined size, by repeating arrangement of the datagrams in order along a first direction according to a second direction; and a generation unit configured to generate a redundant datagram for forward error correction for each of the datagrams belonging to one row, and for each of the datagrams belonging to one column of the matrix arranged by the arrangement unit.

9 Claims, 27 Drawing Sheets

(56) References Cited

U.S. PATENT DOCUMENTS

| | | | |
|---|---|---|---|
| 2008/0002580 A1 | 1/2008 | Kawada et al. | |
| 2008/0178051 A1* | 7/2008 | Huang | H04N 21/64315 |
| | | | 714/704 |
| 2008/0250299 A1 | 10/2008 | Maillet et al. | |
| 2008/0313518 A1* | 12/2008 | Naoe | H04L 1/16 |
| | | | 714/748 |
| 2009/0055715 A1 | 2/2009 | Jashek et al. | |
| 2010/0313093 A1* | 12/2010 | Takaku | H04L 1/0057 |
| | | | 714/746 |
| 2012/0151291 A1* | 6/2012 | Sugimoto | H04L 1/1812 |
| | | | 714/746 |
| 2014/0025771 A1* | 1/2014 | Tanaka | G06F 15/167 |
| | | | 709/213 |

FOREIGN PATENT DOCUMENTS

| | | |
|---|---|---|
| JP | 2007-208418 A | 8/2007 |
| JP | 2008-11096 A | 1/2008 |
| JP | 2011-211616 A | 10/2011 |
| JP | 2012-129751 A | 7/2012 |
| WO | WO 2006/085326 A2 | 8/2006 |
| WO | WO 2006085326 A2 * | 8/2006 ........... H04L 1/0045 |

\* cited by examiner

FIG.5
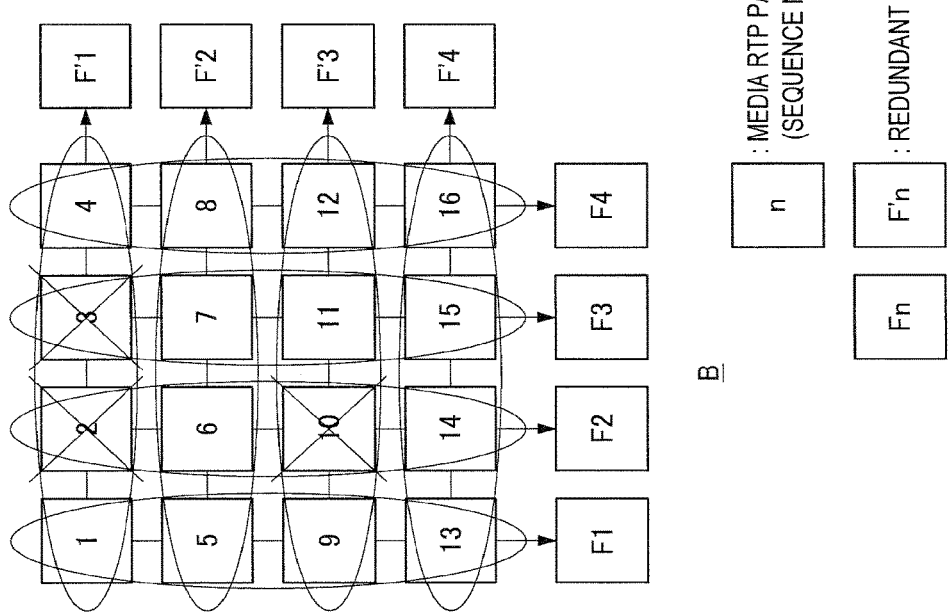
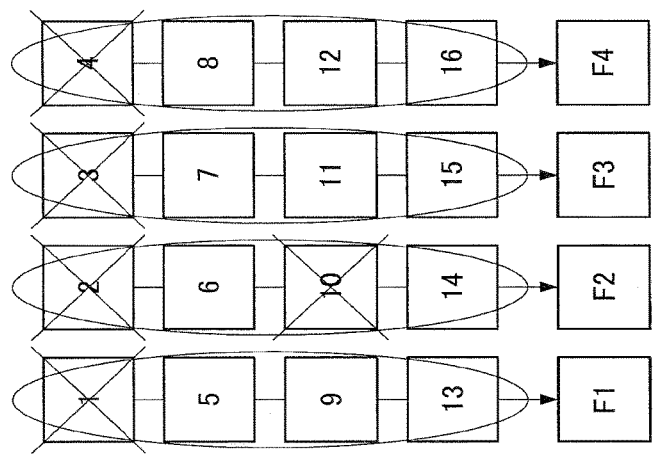

FIG.23

| | RS | XOR BASE |
|---|---|---|
| CALCULATION AMOUNT | HIGH | LOW |
| RECOVERY PERFORMANCE (IN CASE OF SAME BLOCK SIZE/REDUNDANCY) | HIGH | LOW |
| REDUNDANCY CHANGE | POSSIBLE | THERE IS LIMITATION (1D, 2D ONLY) |
| BLOCK SIZE | THERE IS LIMITATION (PROBLEM OF CALCULATION AMOUNT) | TAKEN LARGE |
| LOSS RECOVERY TOLERANCE | IT IS POSSIBLE TO RECOVER ARBITRARY LOSS PATTERN CORRESPONDING TO PARITY NUMBER | RECOVERY IMPOSSIBLE DEPENDING ON PATTERN EVEN IF LOSS CORRESPONDS TO PARITY NUMBER OR LESS |

FIG.24

| | Reed Solomon | ProMPEG | Reed Solomon | ProMPEG |
|---|---|---|---|---|
| BitRate (Mbps) | 150 | | 1500 | |
| NUMBER OF DATA PACKETS | 14 | 16 | 80(※2) | 144 |
| FEC DELAY | 1.12msec | 1.28 | 0.64 | 1.15 |
| REDUNDANT PACKET | 2 | 8 | 3 | 24 |
| REDUNDANCY (%) | 12.5 | 33(※1) | 3 | 14.29 |
| LOSS AFTER RECOVERY | ONCE FOR 37 YEARS | ONCE FOR 1467 YEARS | ONCE FOR 500 YEARS | ONCE FOR 146 YEARS |

INFORMATION PROCESSING APPARATUS, INFORMATION PROCESSING METHOD, AND PROGRAM

TECHNICAL FIELD

The present disclosure relates to an information processing apparatus, an information processing method, and a program.

BACKGROUND ART

Demand has been increasing for transferring multimedia data with low delay, via the internet or another transfer path. Such a demand has noticeably increased, for example, in the fields of camera remote control and gaming, remote medical care and the like.

Various technologies are used for achieving stream-type transfer with low delay. For example, a Realtime Transport Protocol (RTP) prescribed by IETF RFC3550 is used as Internet technology suitable for stream-type transfer system. However, since an RTP or a User Datagram Protocol (UDP) does not guarantee video image quality of network transfer, Quality of Service (QoS) control may become necessary. Accordingly, technology related to a Forward Error Correction (FEC) system for performing QoS control has been developed in recent years.

For example, technology related to FEC for achieving low delay transfer is disclosed in Patent Literature 1.

CITATION LIST

Patent Literature

Patent Literature 1: JP 2011-211616A

SUMMARY

However, if considering the above described circumstances, it is desirable that technology related to FEC for achieving low delay transfer be further improved.

Accordingly, the present disclosure proposes a new and improved information processing apparatus, information processing method, and program, capable of improving technology related to FEC for achieving low delay transfer.

According to the present disclosure, there is provided an information processing apparatus including: an arrangement unit configured to arrange datagrams in a number of a predetermined matrix size or less in at least a portion of the matrix of the predetermined size, by repeating arrangement of the datagrams in order along a first direction according to a second direction; and a generation unit configured to generate a redundant datagram for forward error correction for each of the datagrams belonging to one row, and for each of the datagrams belonging to one column of the matrix arranged by the arrangement unit.

According to the present disclosure, there is provided an information processing method including: arranging datagrams in a number of a predetermined matrix size or less in at least a portion of the matrix of the predetermined size, by repeating arrangement of the datagrams in order along a first direction according to a second direction; and generating a redundant datagram for forward error correction for each of the datagrams belonging to one row, and for each of the datagrams belonging to one column of the arranged matrix.

According to the present disclosure, there is provided a program for causing a computer to function as: an arrangement unit configured to arrange datagrams in a number of a predetermined matrix size or less in at least a portion of the matrix of the predetermined size, by repeating arrangement of the datagrams in order along a first direction according to a second direction; and a generation unit configured to generate a redundant datagram for forward error correction for each of the datagrams belonging to one row, and for each of the datagrams belonging to one column of the matrix arranged by the arrangement unit.

Advantageous Effects of Invention

According to the present disclosure such as described above, it is possible to improve technology related to FEC for achieving low delay transfer.

BRIEF DESCRIPTION OF DRAWINGS

FIG. 5 is a figure which shows an example of FEC decoding of an XOR system.

FIG. 23 is a table which compares the performance of FEC for an XOR system and an RS code system.

FIG. 24 is a table which shows the problems of an XOR system and an RS code system.

DESCRIPTION OF EMBODIMENTS

Figure 1:
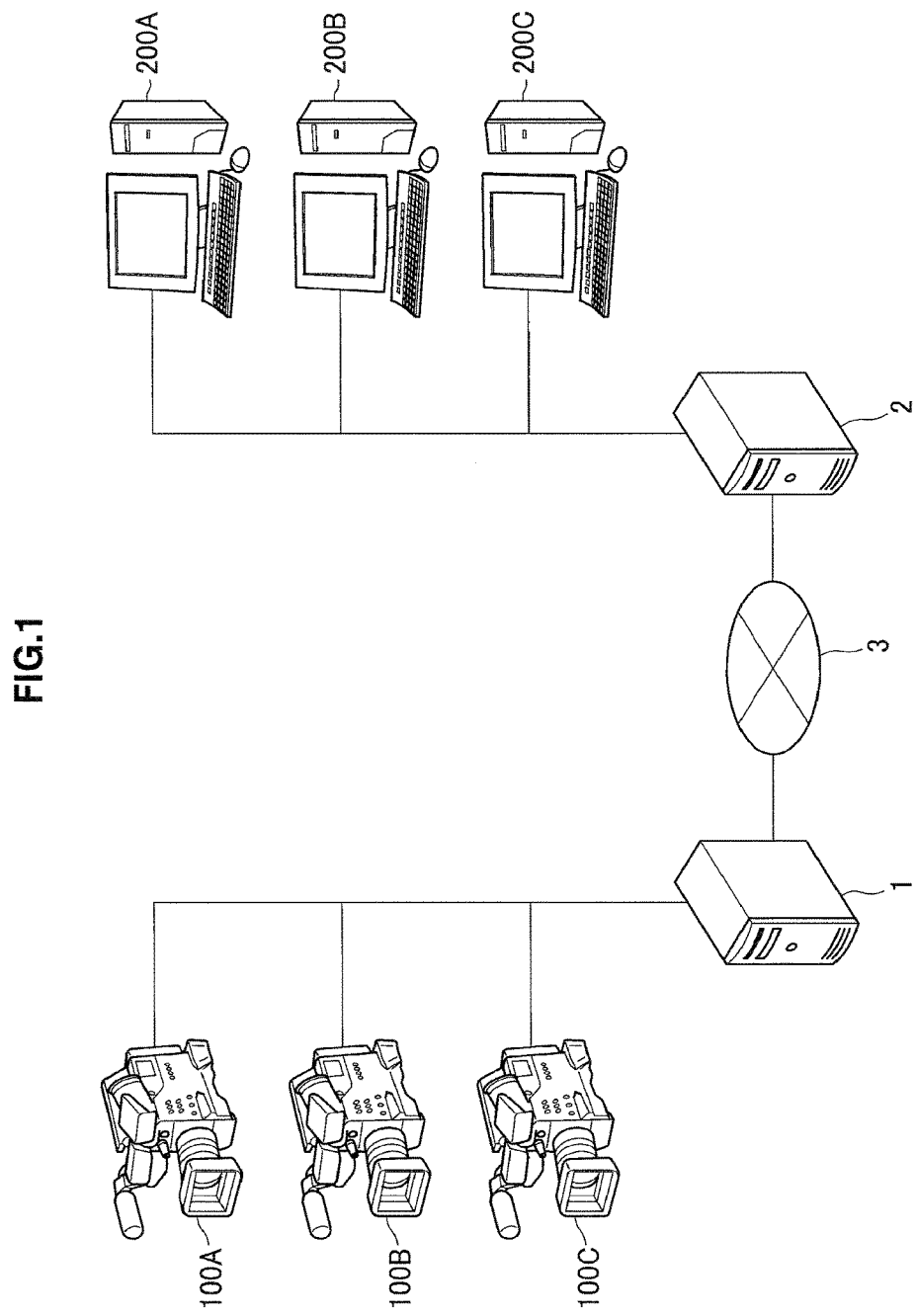
FIG. 1 is an explanatory diagram which shows an outline of a transfer system according to an embodiment of the present disclosure.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

The description will be given in the following order.
1. Outline of the transfer system according to an embodiment of the present disclosure
2. The embodiments
2-1. Basic technology
2-1-1. FEC technology
2-1-2. Format
2-1-3. Encoding and decoding
2-2. First embodiment
2-2-1. Outline
2-2-2. Configuration
2-2-3. Operation processes
2-3. Second embodiment
2-3-1. Outline
2-3-2. Configuration
2-3-3. Operation processes
3. Summary

1. Outline of the Transfer System According to an Embodiment of the Present Disclosure First, an outline of a transfer system according to an embodiment of the present disclosure will be described, by referring to FIG. 1.

FIG. 1 is an explanatory diagram which shows an outline of a transfer system according to an embodiment of the present disclosure. As shown in FIG. 1, the transfer system according to an embodiment of the present disclosure has cameras 100A, 100B, and 100C, editing devices 200A, 200B, and 200C, and a transmission apparatus 1 (information processing apparatus) and a reception apparatus 2 connected by a network 3. Hereinafter, in the case where it may not be particularly necessary to distinguish the cameras 100A, 100B, and 100C, they will be collectively called a camera 100, and similarly, in the case where it may not be particularly necessary to distinguish the editing devices 200A, 200B, and 200C, they will be collectively called an editing device 200.

The transmission apparatus 1 transmits content collected by the plurality of cameras 100 to the reception apparatus 2 by encoding, packetizing, and FEC encoding. The reception apparatus 2 outputs the data received from the transmission apparatus 1 to the plurality of editing devices 200 by FEC decoding, de-packetizing, and decoding. It is assumed that the transfer system according to the present embodiment is used at a production site for collecting/editing content in real time, by the plurality of cameras 100 and editing devices 200 such as shown in FIG. 1. At such a production site, is the demand will be high for low delay of transfer, and an improvement of technology relating to encoding/decoding by FEC for achieving low delay transfer will be requested.

Accordingly, transfer systems have been conceived according to each of the embodiments of the present disclosure by focusing on the above mentioned circumstances. The transfer system according to each of the embodiments of the present disclosure can achieve low delay transfer. Hereinafter, the transfer system according to each of the embodiments of the present disclosure will be described in detail.

Moreover, the transmission apparatus 1 may not only transmit video data by the camera 100, but also audio data by a microphone, which is not illustrated, or metadata, to the reception apparatus 2. Further, the reception apparatus 2 may output received data not only to the editing device 200, but also to an output apparatus such as a display or a speaker, which is not illustrated.

2. The Embodiments

[2-1. Basic Technology]

First, the basic technology commonly used by each of the embodiments will be described.

[2-1-1. FEC Technology]

The transmission apparatus 1 performs QoS control, in order to achieve stable transfer quality and high user experience quality in accordance with the condition of the network 3 such as a packet loss rate, transfer delay, or a mixing degree (congestion). Specifically, the transmission apparatus 1 encodes transmission data by FEC. FEC is lost packet recovery technology, using redundant packets. Hereinafter, encoding by FEC will be described, by referring to FIG. 2.

Figure 2:
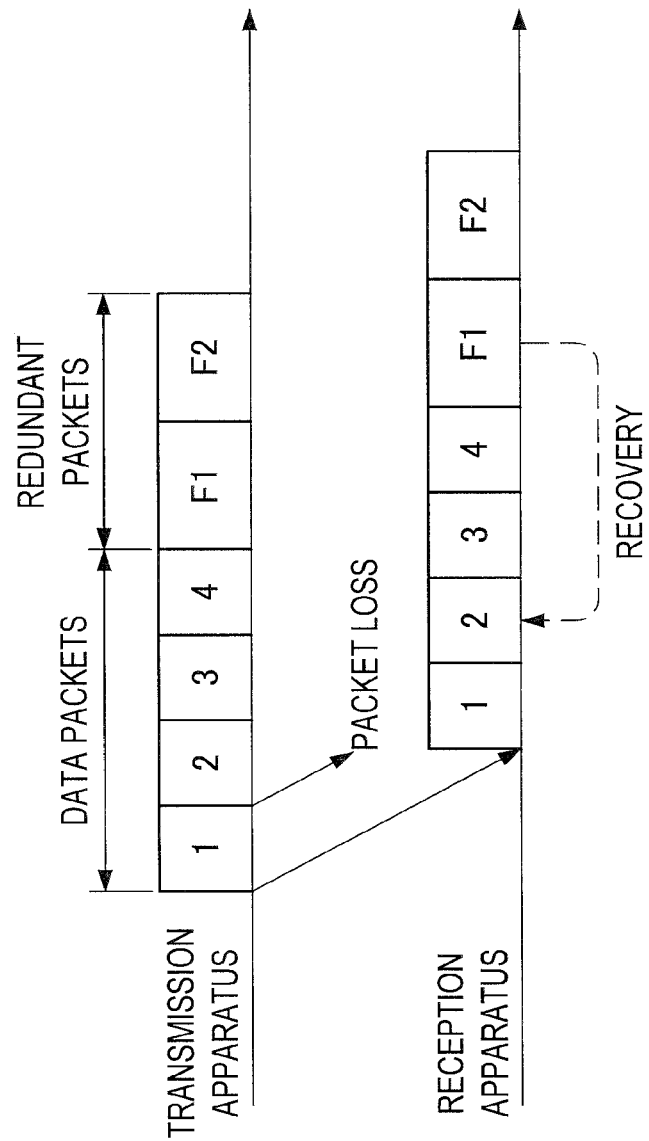
FIG. 2 is a figure for describing FEC encoding by a transmission apparatus according to a present embodiment.

FIG. 2 is a figure for describing FEC encoding by the transmission apparatus 1 according to the present embodiment. As shown in FIG. 2, the transmission apparatus 1 transmits data packets and redundant packets to the reception apparatus 2, by generating redundant packets from the original data packets, as a preparation for packet loss. By using the received original packets and redundant packets, in the case where packet loss occurs during transfer, the reception apparatus 2 can recover a lost packet such as shown in FIG. 2.

A system using an exclusive OR (XOR: eXclusive OR) calculation, and 2 systems with a form using a Reed-Solomon (RS) code, are mainly used as an encoding system of FEC. There is GenericFEC (IETF RFC5109), LDPC (RFC5170), and Pro-MPEG FEC (SMPTE 2022-1-2007, 2022-5) as an XOR system. Moreover, in relation to LDPC, there is a description for a large block size in RFC5170, and FEC block delay becomes long. Further, Pro MPEG FEC is used for an IPTV (Internet broadcast) standard, such as IPTV Forum, Open IPTV forum, or DVB-IP. Moreover, Pro-MPEG FEC 1D is a standard which generates XOR redundant packets in a vertical direction, and Pro-MPEG FEC 2D is a standard which generates XOR redundant packets in the 2 directions of vertical and horizontal. The details of these standards are provided in SMPTE 2022-1-2007, "Forward Error Correction for Real-Time Video/Audio Transport over IP Networks", 2007, SMPTE 2022-5-2012. A two-dimensional FEC system of an XOR system is often used for video transfer. First, FEC encoding/decoding of an XOR system will be described, by referring to FIG. 3 to FIG. 5.

Figure 3:
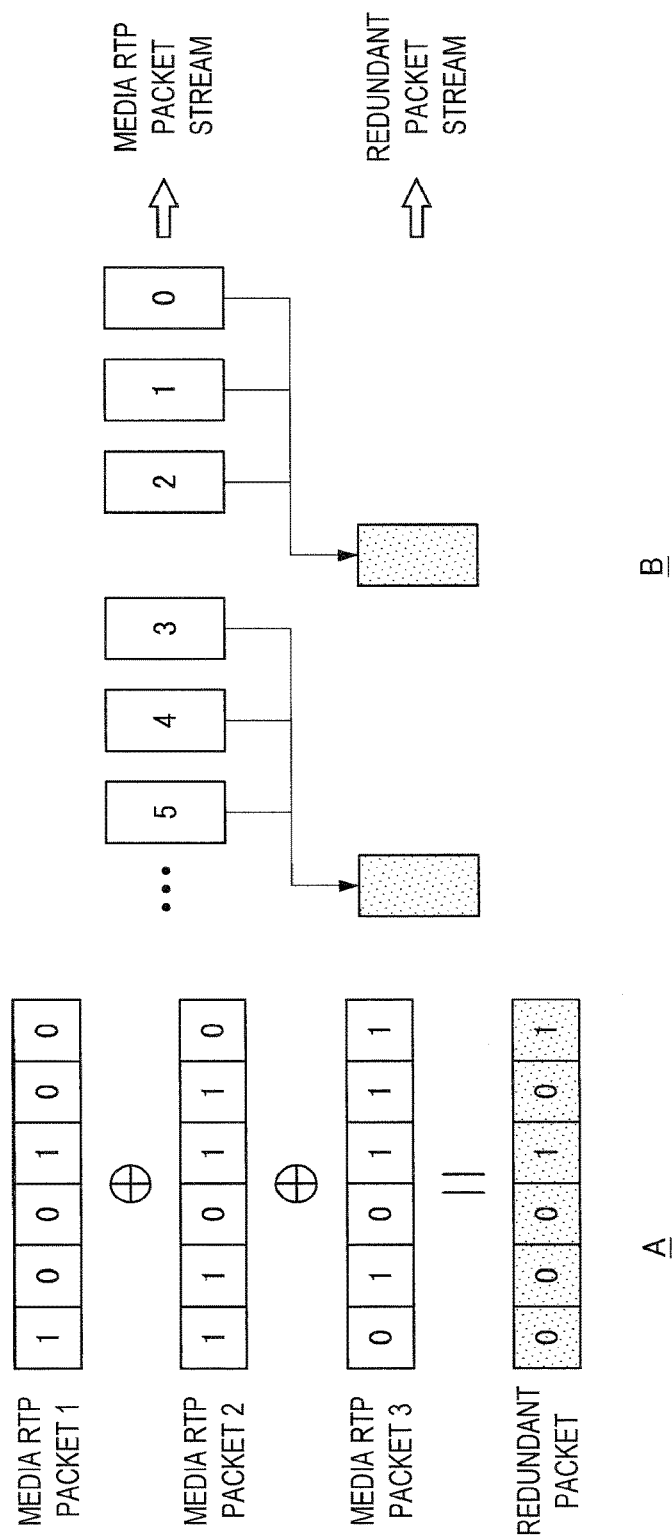
FIG. 3 is a figure for describing FEC encoding of an XOR system.

FIG. 3 is a figure for describing FEC encoding of an XOR system. More specifically, FIG. 3A shows a generation example of a redundant packet, and FIG. 3B shows a stream generation example. As shown in FIG. 3A, the transmission side generates a redundant packet by an XOR calculation of each of the bits of the media RTP packets constituting content. Also, as shown in FIG. 3B, the transmission side transmits the media RTP packets as a media RTP packet stream, and transmits the redundant packets as a redundant packet stream. Here, a set of packets, constituted by the media RTP packets used for redundant packet generation and the redundant packet, will hereinafter be called an FEC block. In the case where the transmission side performs FEC encoding of an XOR system, the reception side can perform recovery up until one packet loss within an FEC block.

Figure 4:
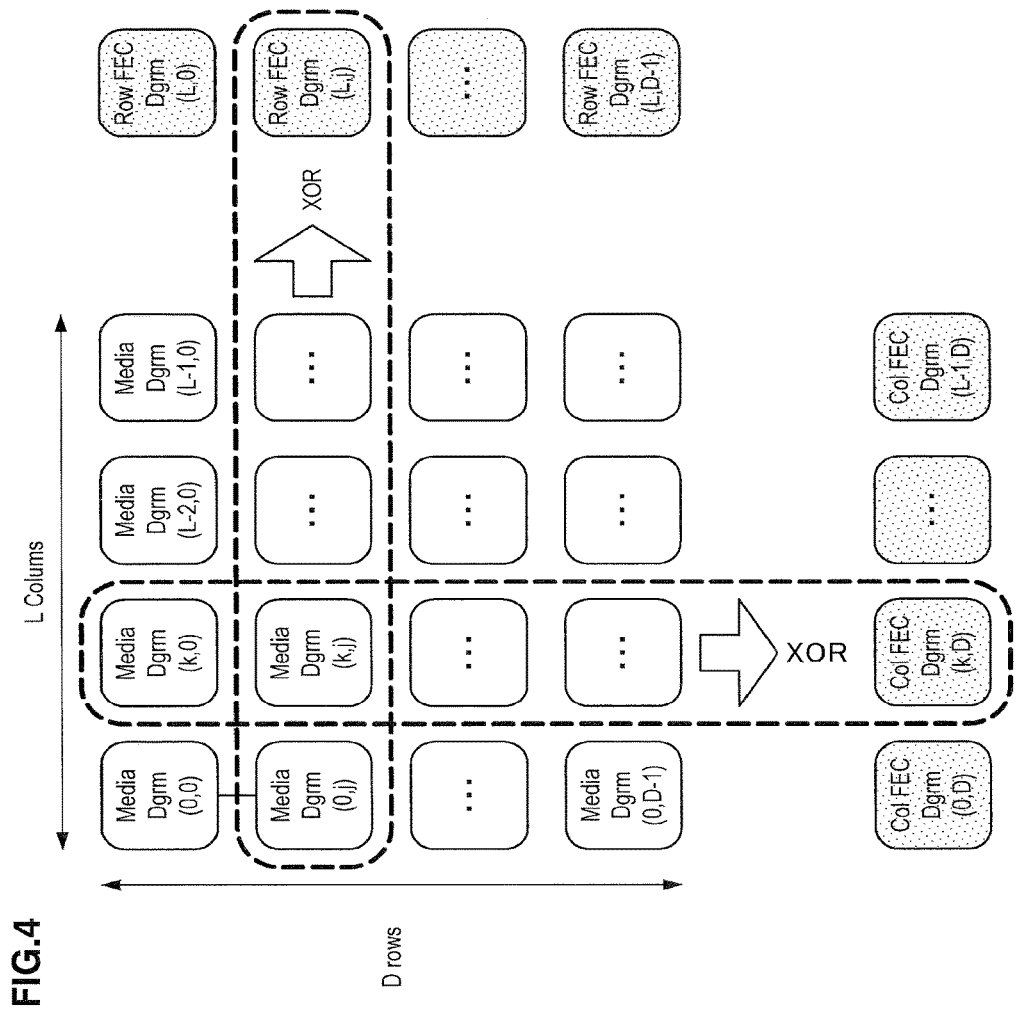
FIG. 4 is a figure for describing FEC encoding of a two-dimensional XOR system.

FIG. 4 is a figure for describing FEC encoding of a two-dimensional XOR system. As shown in FIG. 4, the transmission side generates FEC datagrams (redundant packets) by an XOR calculation by a row unit or a column unit, for media datagrams (datagrams) arranged in a 4×4 two-dimensional matrix. In the present disclosure, FEC datagrams are generated by using a media datagram matrix with L columns and D rows (a matrix with a predetermined matrix size), by setting the matrix size of an FEC block to L columns and D rows. Moreover, Media Dgrm within FIG. 4 shows a media datagram, Row FEC Dgram shows a FEC datagram of a row unit, and Col FEC Dgram shows a FEC datagram of a column unit. Further, the reference numerals (k, j) shown in each media datagram and each FEC datagram show that this datagram is positioned at k column and j row.

Here, while the redundancy increases compared to FEC encoding of a one-dimensional XOR system, FEC encoding of a two-dimensional XOR system has the feature of the recovery rate also improving. More specifically, in the case of a two-dimensional XOR system, while there are also patterns which are not able to be recovered, recovery is possible for a 2 packet loss in the case where mostly within a same row or column. This point will be described by referring to FIG. 5. FIG. 5 is a figure which shows an example of FEC decoding of an XOR system. More specifically, FIG. 5A is a figure which shows a decoding example of data encoded by a one-dimensional XOR system (Pro-MEPG FEC 1D) of a vertical direction. FIG. 5B is a figure which shows a decoding example of data encoded by a two-dimensional XOR system (Pro-MEPG FEC 2D) of a vertical direction and a horizontal direction.

In FIG. 5A, the case is shown in which media RTP packets (media datagrams) of sequence numbers 1, 2, 3, and 4 have a sequential packet loss. Here, the packet of the sequence number 1 can be recovered by an XOR calculation of a vertical direction. This is because there is 1 packet lost within the same column. The packets of the sequence numbers 3 and 4 can be similarly recovered. On the other hand, since the packets of the sequence numbers 2 and 10 are 2 packets lost in the same column, they are not able to be recovered. In contrast to this, as shown in FIG. 5B, since a burst packet loss tolerance is improved, the data encoded by a two-dimensional XOR system can recover a lost packet in such a case. More specifically, since there is 1 packet lost within the same row, the packet of the sequence number 10 can be recovered by an XOR calculation of a horizontal direction. In this way, the packet of the sequence number 10 is recovered, and thereafter the packet of the sequence number 2 becomes 1 packet lost within the same column, and so it can be recovered by an XOR calculation of a vertical direction. Moreover, in Pro-MEPG FEC, the transmission side generally transfers the media RTP packets and the redundant packets by separate ports.

Heretofore, FEC encoding/decoding of an XOR system has been described. Further, FEC encoding/decoding of an RS code system will be described, by referring to FIG. 6.

Figure 6:
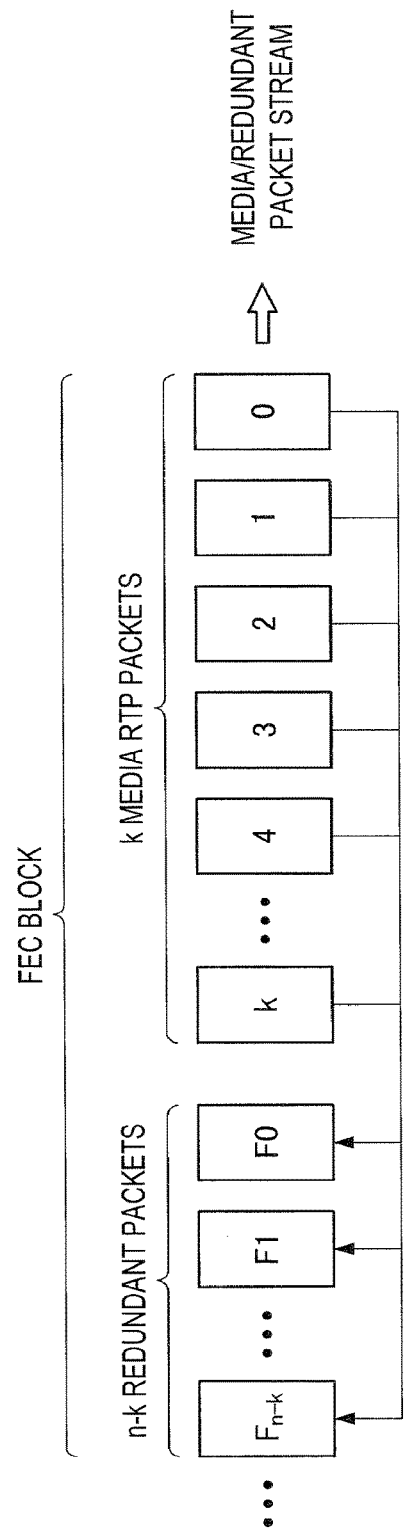
FIG. 6 is a figure for describing FEC encoding of an RS code system.

FIG. 6 is a figure for describing FEC encoding of an RS code system. As shown in FIG. 6, in the case where an RS (n,k) code is used, the transmission side generates an FEC block by n-k redundant packets for k media RTP packets. Also, the transmission side transmits the media RTP packets and the redundant packets as a media/redundant packet stream. In the case where the transmission side performs FEC encoding of an RS code system, the reception side can perform recovery for an arbitrary n-k (the number of redundant packets) packet loss within the FEC block. Since there is a limitation for the pattern of a loss capable being recovered in an XOR system, it can be said that an RS code system, which does not have a limitation for a loss pattern, is superior.

Heretofore, FEC technology has been described. Further, the format of a media datagram and an FEC datagram will be described, by referring to FIG. 7 to FIG. 12.

[2-1-2. Format]

Figure 7:
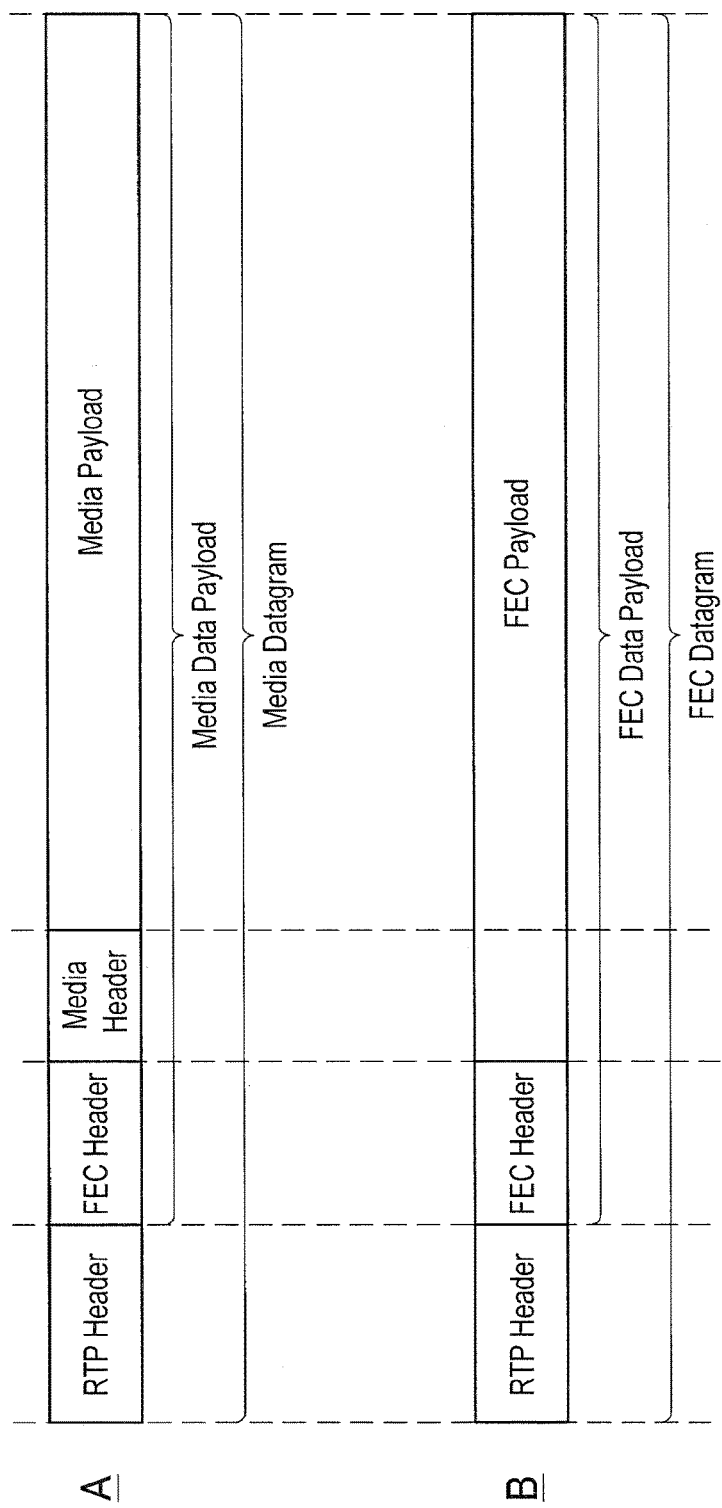
FIG. 7 is an explanatory diagram which shows a format of an RTP packet according to an embodiment of the present disclosure.

FIG. 7 is an explanatory diagram which shows a format of an RTP packet according to an embodiment of the present disclosure. More specifically, FIG. 7A shows a format of a media datagram, and FIG. 7B shows a format of an FEC datagram. As shown in FIG. 7A, a media datagram is constituted by an RTP Header, an FEC Header, a Media Header, and a Media Payload. Further, as shown in FIG. 7B, an FEC datagram is constituted by an RTP Header, an FEC Header, and an FEC Payload.

At least one of video data, audio data, and metadata constituting content is stored in the Media Payload. Further, data which shows redundant symbols generated by FEC encoding is stored in the FEC Payload. Hereinafter, the RTP Header, the FEC Header, and the Media Header will be described in detail.

(RTP Header)

Figure 8:
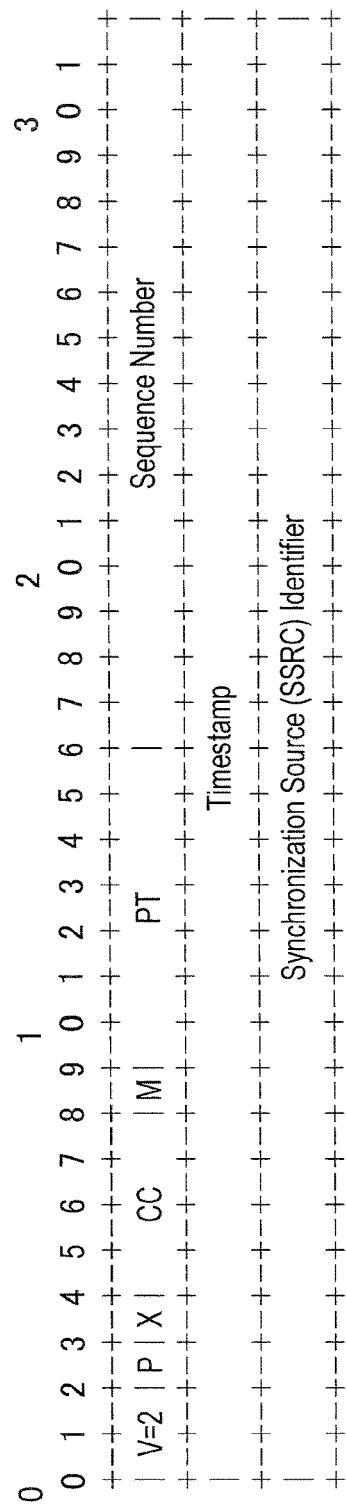
FIG. 8 is an explanatory diagram which shows a format of an RTP Header according to an embodiment of the present disclosure.

FIG. 8 shows a format of an RTP Header. FIG. 8 is an explanatory diagram which shows a format of an RTP Header according to an embodiment of the present disclosure. As shown in FIG. 8, in the present embodiment, an RTP Header based on a specification of RFC 3550 is used.

(FEC Header in the Case of an XOR System)

Further, a field configuration of an FEC Header in the case of an XOR system will be described. An FEC Header in the case of an XOR system has a Frame Count, an FEC Type, a Packet Type, an FEC Block Last, an L Max, a D Max, an L Count, a D Count, and an FEC Block ID.

Frame Count

A value unique to an FEC block is stored in the present field. In an FEC datagram, a value the same as that of a media datagram belonging to the same FEC block is stored.

FEC Type

A value which shows the type of used FEC system, such as an XOR system or an RS code system, is stored in the present field.

Packet Type

A value which shows the type of datagram, such as a media datagram, an FEC datagram of a row unit, or an FEC datagram of a column unit, is stored in the present field.

FEC Block Last

In the case of an FEC block of pattern 2, predetermined flags (Last flags) for identifying that it is a last media datagram, a last FEC datagram of a row unit, and a last FEC datagram of a column unit, are stored in the present field.

L Max

A value of the number of columns L of media datagrams of L columns and D rows of an FEC block is stored in the present field. In the case of an FEC block of pattern 2, a value the same as the case of an FEC block of pattern 1 is stored, regardless of the number of media datagrams included in the FEC block.

D Max

A value of the number of rows D of media datagrams of L columns and D rows of an FEC block is stored in the present field. In the case of an FEC block of pattern 2, a value the same as the case of an FEC block of pattern 1 is stored, regardless of the number of media datagrams included in the FEC block.

L Count

A row number of a media datagram or an FEC datagram is stored in the present field. Specifically, a value from 0 up until the number of columns L of a media datagram matrix included in an FEC block is stored. While the value becomes L in the case of an FEC datagram of a row unit, there will be cases where a different value is set in the case of pattern 2.

D Count

A column number of a media datagram or an FEC datagram is stored in the present field. Specifically, a value from 0 up until the number of rows D of a media datagram matrix included in an FEC block is stored. While the value becomes D in the case of an FEC datagram of a column unit, there will be cases where a different value is set in the case of pattern 2.

FEC Block ID

A value unique to an FEC block is stored in the present field. The present field is a value which is incremented, for example, every time an FEC block is generated.

(FEC Header in the Case of an RS Code System)

Heretofore, a field configuration of an FEC Header in the case of an XOR system has been described. Further, a field configuration of an FEC Header in the case of an RS code system will be described. An FEC Header in the case of an RS code system has a Frame Count, an FEC Type, a Media Datagram Number, an FEC Datagram Number, and an FEC Block ID. Hereinafter, only the fields different to those of an XOR system will be described.

Media Datagram Number

A value which shows the total number of media datagrams in a belonging FEC block is stored in the present field. More specifically, k values of an RS (n,k) code are stored.

FEC Datagram Number

A value which shows the total number of FEC datagrams in a belonging FEC block is stored in the present field. More specifically, n-k values of an RS (n,k) code are stored.

Heretofore, a field configuration of an FEC header in the case of an RS code system has been described. Further, encoding and decoding of a media datagram, which has the format described with reference to FIG. 7, will be described.

[2-1-3. Encoding and Decoding]

Figure 9:
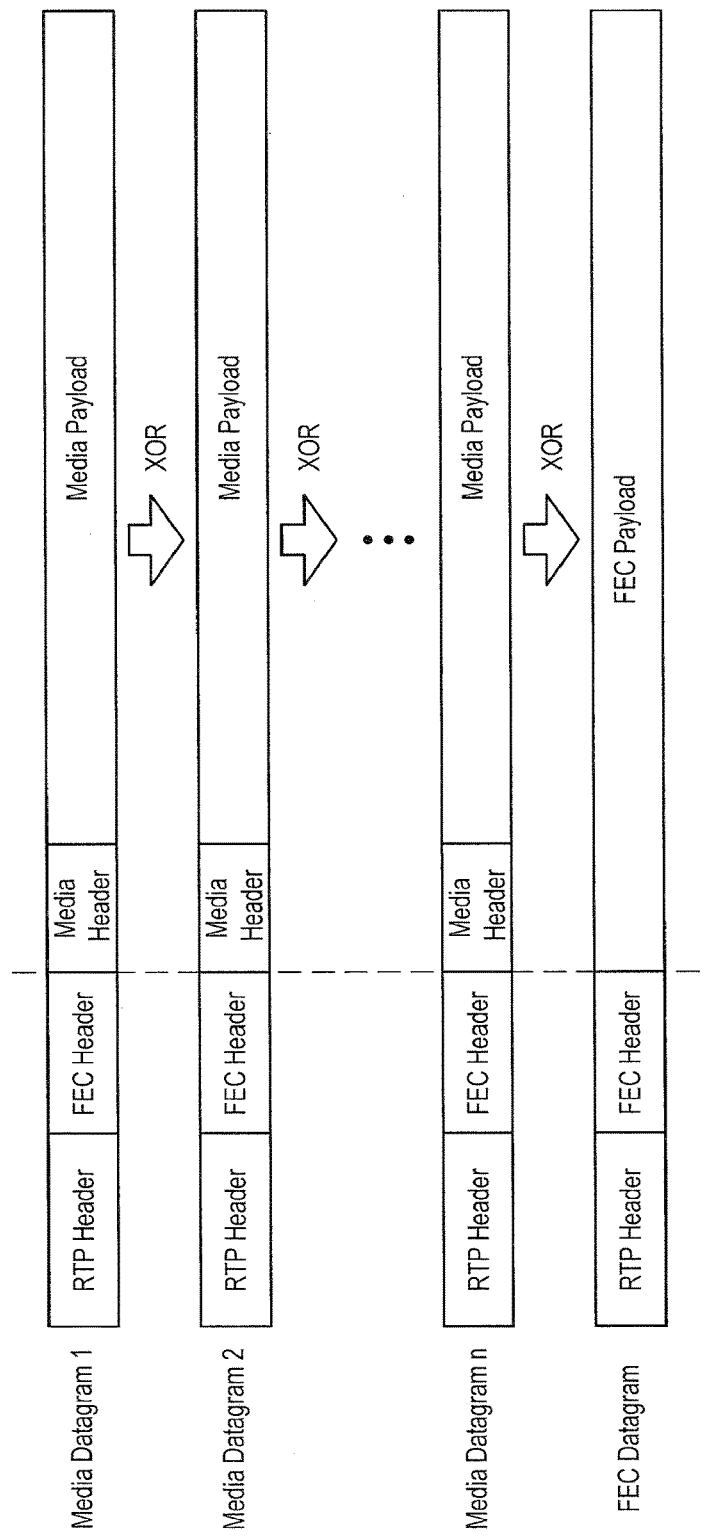
FIG. 9 is a figure for describing encoding of a media datagram in FEC of an XOR system.
Figure 10:
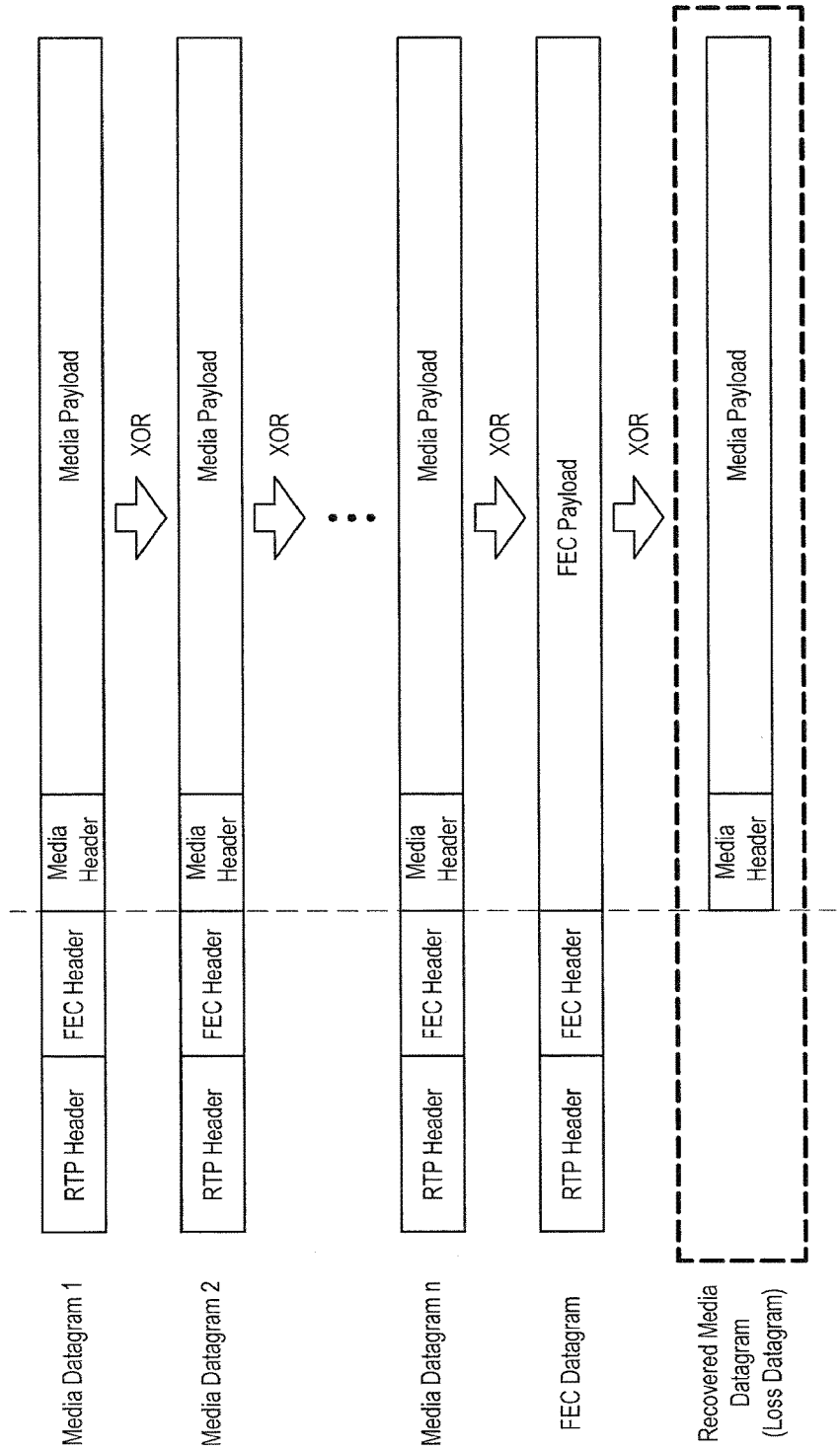
FIG. 10 is a figure for describing decoding of a media datagram in FEC of an XOR system.

First, encoding and decoding in an XOR system by the present embodiment will be described, by referring to FIG. 9 and FIG. 10. FIG. 9 is a figure for describing encoding of a media datagram in FEC of an XOR system. FIG. 10 is a figure for describing decoding of a media datagram in FEC of an XOR system.

As shown in FIG. 9, the transmission apparatus 1 generates an FEC Payload of an FEC datagram, by XOR calculating bits at a same position, of the Media Header and Media Payload of each media datagram. In the case where there is a packet loss in a media datagram, the reception apparatus 2 recovers the media datagram with a packet loss by the method shown in FIG. 10. More specifically, the reception apparatus 2 recovers the media datagram with a packet loss, by XOR calculating bits at a same position, of the Media Header and Media Payload of the received media datagram, and the FEC datagram FEC Payload.

Figure 11:
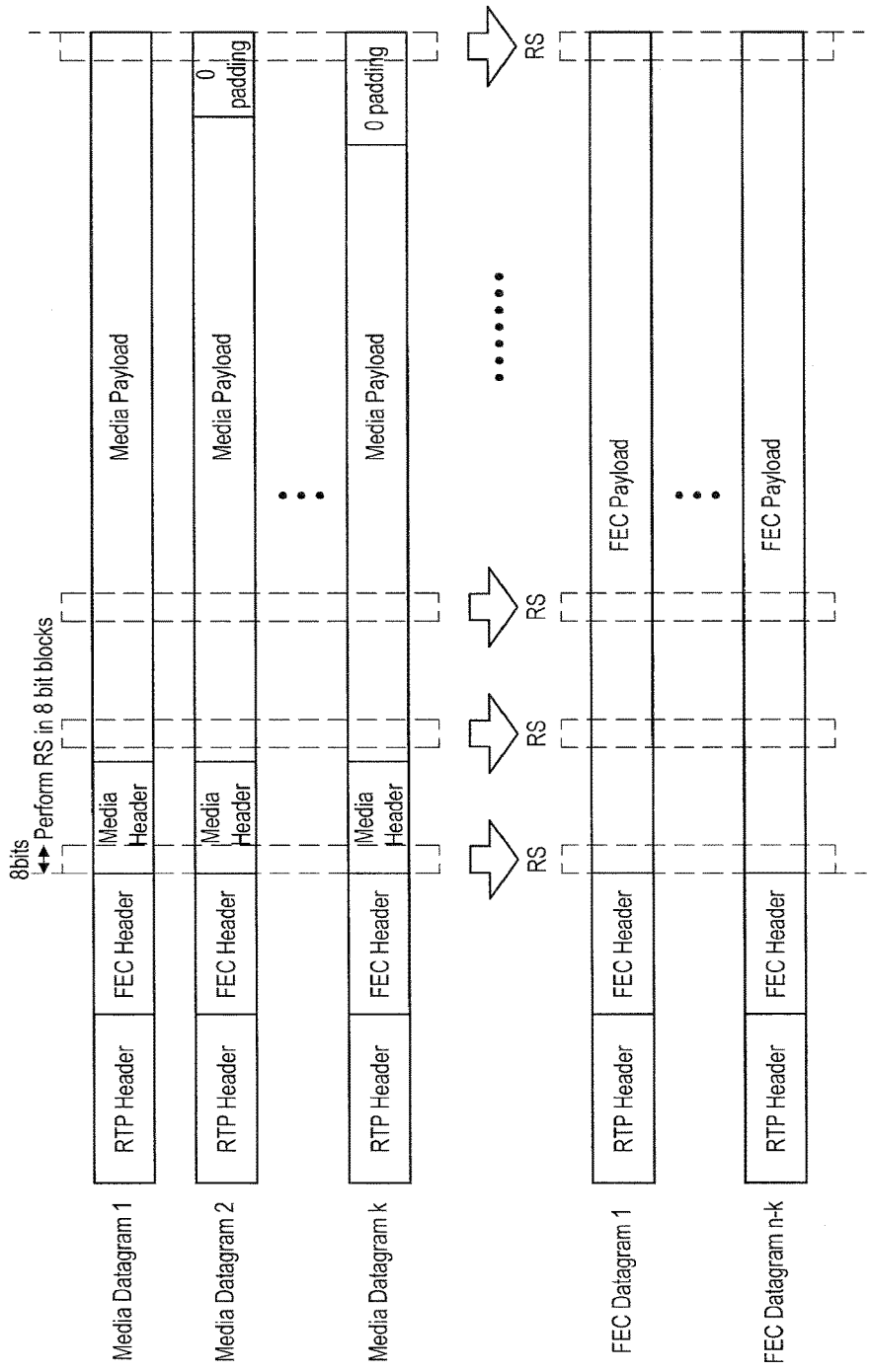
FIG. 11 is a figure for describing encoding of a media datagram in FEC of an RS code system.
Figure 12:
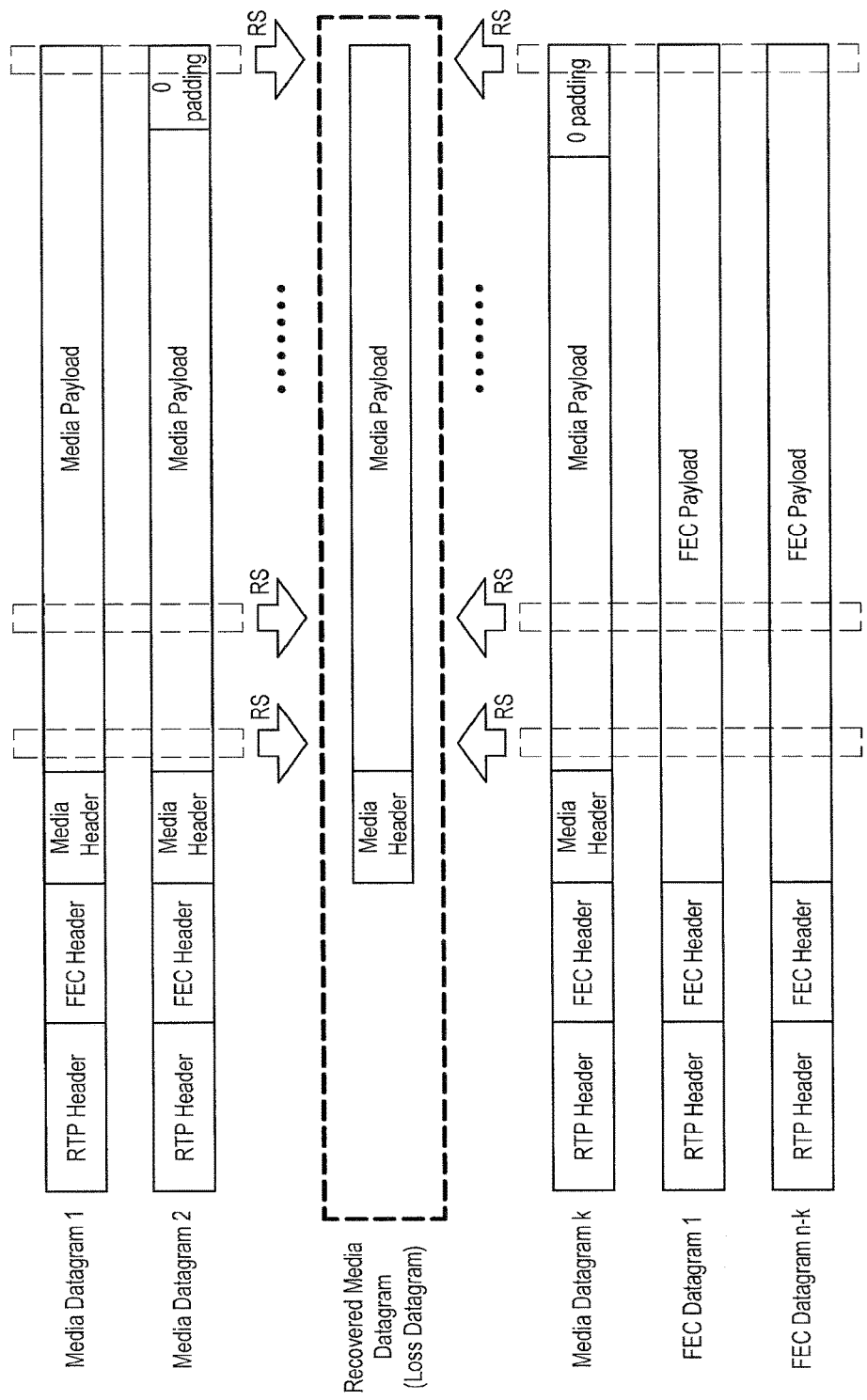
FIG. 12 is a figure for describing decoding of a media datagram in FEC of an RS code system.

Heretofore, encoding and decoding in an XOR system by the present embodiment has been described. Further, encoding and decoding in an RS code system by the present embodiment will be described, by referring to FIG. 11 and FIG. 12. FIG. 11 is a figure for describing encoding of a media datagram in FEC of an RS code system. FIG. 12 is a figure for describing decoding of a media datagram in FEC of an RS code system.

As shown in FIG. 11, the transmission apparatus 1 generates an FEC Payload of n-k FEC datagrams every 8 bits, by encoding 8 bits at a same position by an RS code, of the Media Header and Media Payload of k media datagrams. In the case where there is a packet loss in a media datagram, the reception apparatus 2 recovers the media datagram with a packet loss by the method shown in FIG. 12. More specifically, the reception apparatus 2 recovers the media datagram with a packet loss, by decoding the 8 bits at a same position as an RS code, of the Media Header and Media Payload of the received media datagram, and the FEC datagram FEC Payload. Heretofore, encoding and decoding in an RS code system by the present embodiment has been described.

2-2. First Embodiment

[2-2-1. Outline]

In the present embodiment, transfer with low delay is achieved, by an FEC system based on frame breaks of a Video. First, an outline of the present embodiment will be described.

The transfer system according to the present embodiment is applied to a system which requests low delay of a frame or less in addition to a process of a frame relation, such as a content production site or remote control, or uninterrupted video switching. In such a system, since there is also an influence on delay to the extent of the number of packets, it is requested to easily identify the segmentation of frames produced by the switching of a video or the like, and to identify the frame segmentations at a high speed.

Here, in the case where FEC of a two-dimensional XOR system is used, an L×R rectangular FEC block is usually used, and so there will be the following problem in FEC of a two-dimensional XOR system. Firstly, there will be a limit on the number of packets, the redundancy or the like of an FEC block in order to retain the L×R rectangle. Secondly, since padding for retaining the rectangle is performed by dummy packets in the case where the number of packets is insufficient, wasteful packet transfer will occur. Thirdly, in the case where processes based on an FEC block and frame breaks of a video are not performed at all, delay will occur in processes with frame units. More specifically, since the transmission side segments an FEC block with breaks of a frame, and retains the rectangle of the FEC block by padding dummy packets, wasteful packet transfer will occur.

Accordingly, in the present embodiment, in the case where it may be necessary to process a video with frame field units, an FEC system is achieved based on the frame fields. More specifically, the transmission apparatus 1 according to the present embodiment causes the generation of an FEC block to end in the middle without retaining a rectangle in the case of frame segmentation. Further, the transmission apparatus 1 according to the present embodiment shortens the recovery time in the reception apparatus 2 by adjusting the transfer timing of redundant packets. In addition, the transmission apparatus 1 according to the present embodiment defines plurality of Last flags, and the reception apparatus 2 specifies frame segmentation positions with low delay.

Heretofore, an outline of the present embodiment has been described. Further, a configuration of the transfer system according to the present embodiment will be described, by referring to FIG. 13 to FIG. 19.

[2-2-2. Configuration]

Figure 13:
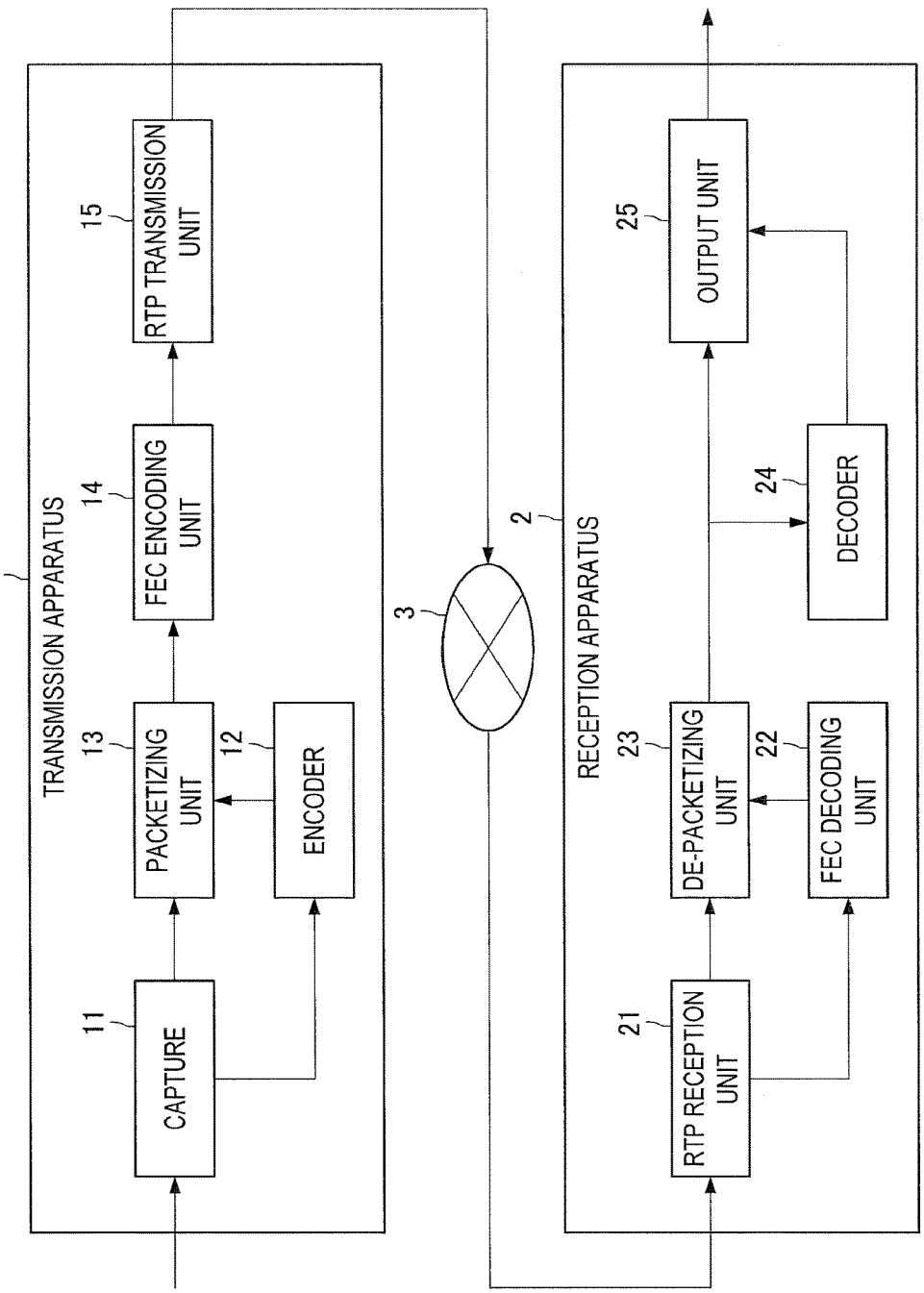
FIG. 13 is a block diagram which shows a configuration of a transfer system according to a first embodiment.

FIG. 13 is a block diagram which shows a configuration of the transfer system according to a first embodiment. As shown in FIG. 13, the transmission apparatus 1 and the reception apparatus 2 are connected by the network 3.

(Transmission Apparatus 1)

As shown in FIG. 13, the transmission apparatus 1 has a capture 11, an encoder 12, a packetizing unit 13, an FEC encoding unit 14, and an RTP transmission unit 15.

Capture 11

The capture 11 has a function which captures content data (moving image content) supplied from the outside. More specifically, the capture 11 captures video data supplied from the camera 100, audio data by a microphone, or metadata. The capture 11 outputs the captured content data to the encoder 12. Here, in the case where it may not be necessary to perform compression encoding by the encoder 12 (in the case where transmitting as RAW data), the capture 11 may output the captured content data to the packetizing unit 13 as it is without compression.

Encoder 12

The encoder 12 compression encodes the content data supplied from the capture 11. The encoder 12 outputs the compression-encoded data to the packetizing unit 13.

Packetizing Unit 13

The packetizing unit 13 packetizing the data supplied from the capture 11 or the encoder 12 into RTP packets (media datagrams). Further, the packetizing unit 13 functions as an input unit which inputs media datagrams constituting content data of frame units to the FEC encoding unit 14. More specifically, the packetizing unit 13 outputs the data supplied from the capture 11 or the encoder 12 to the FEC encoding unit 14 for each frame segmentation. Moreover, other than frame segmentation, the packetizing unit 13 may supply media datagrams to the FEC encoding unit 14, by segmenting the content data according to a time-out.

FEC Encoding Unit 14

The FEC encoding unit 14 FEC encodes the packets supplied from the packetizing unit 13. In FEC encoding, packets are redundant encoded by a forward error correction code of an XOR system, an RS code system or the like. In the present embodiment, the packetizing unit 13 performs FEC encoding by a two-dimensional XOR system. A detailed configuration of the FEC encoding unit 14 will be described by referring to FIG. 14.

Figure 14:
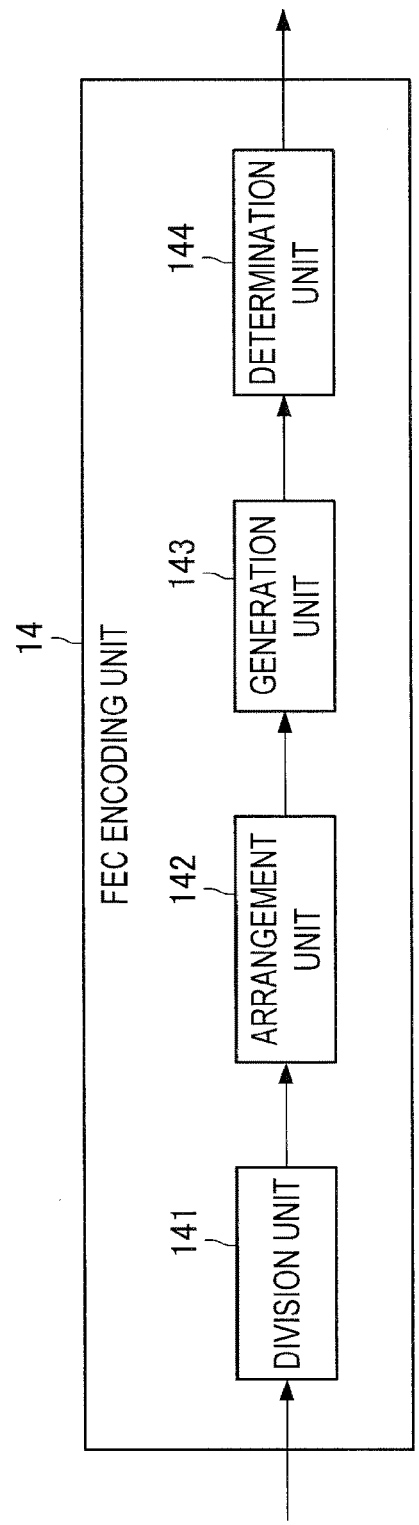
FIG. 14 is a block diagram which shows a configuration of an FEC encoding unit according to a first embodiment.

FIG. 14 is a block diagram which shows a configuration of the FEC encoding unit 14 according to the first embodiment. As shown in FIG. 14, the FEC encoding unit 14 functions as a division unit 141, an arrangement unit 142, a generation unit 143, and a determination unit 144.

Division Unit 141

The division unit 141 has a function which divides data of frame units (1 or more media datagrams) supplied from the packetizing unit 13 into groups for the number of a matrix size (a predetermined matrix size) of an FEC block. For example, in the case where performing FEC encoding of an XOR system by a 4×4 two-dimensional matrix, the division unit 141 divides the media datagrams into 16. The division unit 141 outputs media datagrams to the arrangement unit 142 for each group.

Here, in the case where the number of media datagrams supplied from the FEC encoding unit 14 is not dividable by the number of the matrix size of an FEC block, a group can be produced which has media datagrams in a number which does not fill the matrix size of an FEC block. Hereinafter, a group which has media datagrams in the number of the matrix size of an FEC block will be called a group of pattern 1, and a group which has media datagrams in a number which does not fill the matrix size of an FEC block will be called a group of pattern 2.

Arrangement Unit 142

The arrangement unit 142 has a function which arranges media datagrams in a number of a matrix size or less of an FEC block in at least one portion of an FEC block, by repeating arrangement of the media datagrams in order along a horizontal direction (first direction) according to a vertical direction (second direction). An example of an arrangement of media datagrams by the arrangement unit 142 will be described by referring to FIG. 15.

Figure 15:
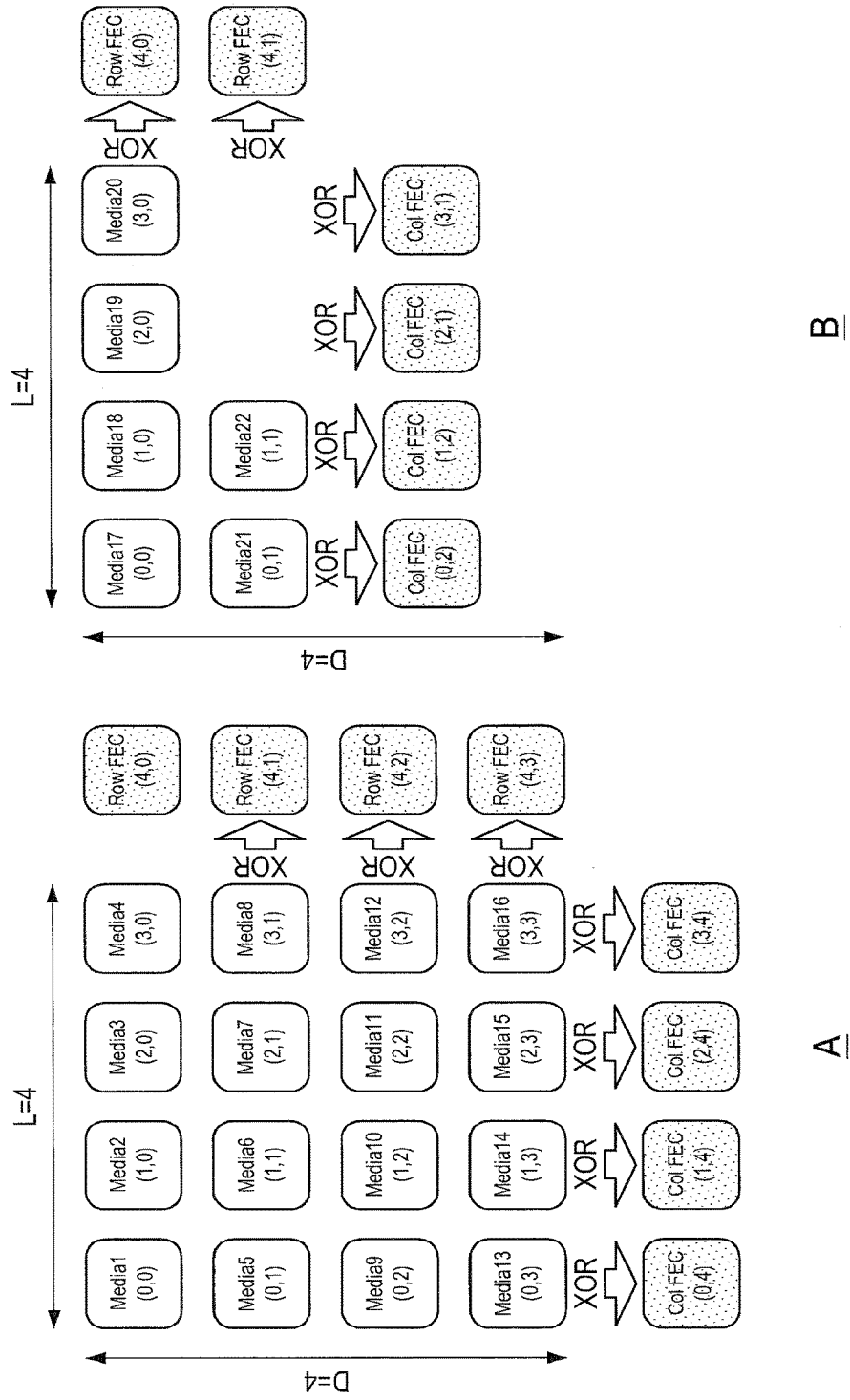
FIG. 15 is a figure for describing encoding by the FEC encoding unit according to a first embodiment.

FIG. 15 is a figure for describing encoding by the FEC encoding unit 14 according to the first embodiment. More specifically, FIG. 15 shows an example of FEC encoding in the case where 1 frame is generated from 22 packets, and the FEC encoding unit 14 generates 2 FEC blocks of the FEC block shown in FIG. 15A and the FEC block shown in FIG. 15B. FIG. 15A shows FEC encoding of a group of pattern 1, and FIG. 15B shows FEC encoding of a group of pattern 2. Moreover, while FIG. 15 shows an example in which the matrix size of an FEC block is set to 4 rows and 4 columns, the FEC encoding unit 14 may set the matrix size of an FEC block to another arbitrary matrix size.

As shown in FIG. 15, the arrangement unit 142 sequentially arranges the media datagrams in order in a horizontal direction, in the order of the media datagram of a sequence number 1 in 0 column and 0 row, and the media datagram of a sequence number 2 in 1 column and 1 row. Also, in the case where the column size (4 in FIG. 15) of the FEC block is filled, the arrangement unit 142 arranges the media datagrams in the FEC block, by repeating the same arrangement in the 1st row, the 2nd row, and the 3rd row. Therefore, as shown in FIG. 15A, in the case of a group of pattern 1, the arrangement unit 142 arranges the media datagrams in the number of the matrix size of the FEC block divided by the division unit 141, in the entire FEC block. Further, as shown in FIG. 15B, in the case of a group of pattern 2, the arrangement unit 142 arranges the media datagrams in a number of less than the matrix size of the FEC block divided by the division unit 141, in a portion of the FEC block.

Generation Unit 143

The generation unit 143 has a function which generates FEC datagrams (redundant datagrams) for forward error correction, for the media datagrams which belong to one row, and for the media datagrams which belong to one column, of the matrix arranged by the arrangement unit 142. The generation unit 143 generates FEC datagrams by an XOR calculation of the media datagrams which belong to one row or column. Here, the generation of FEC datagrams in a group of pattern 2 will be described by referring to FIG. 16.

Figure 16:
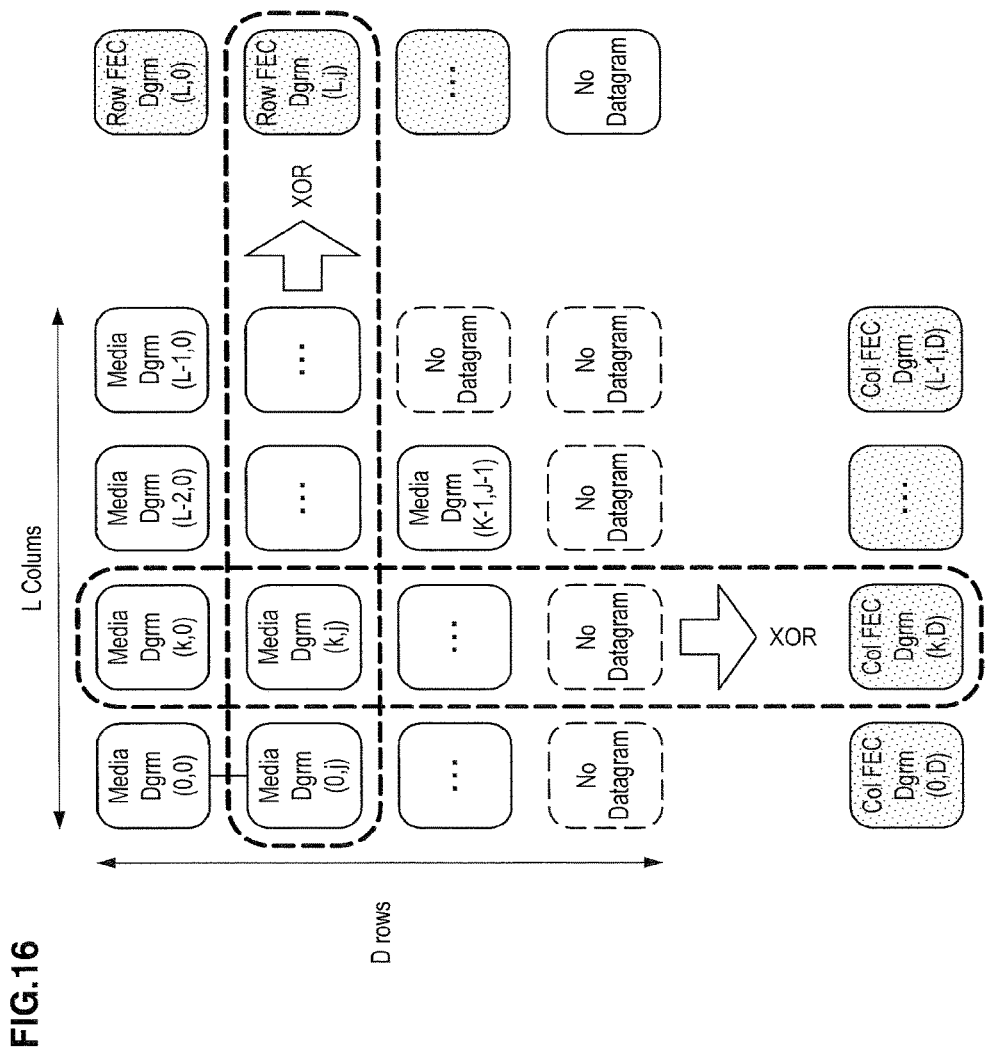
FIG. 16 is a figure for describing the generation of an FEC datagram by a generation unit according to a first embodiment.

FIG. 16 is a figure for describing the generation of FEC datagrams by the generation unit 143 according to the first embodiment. As shown in FIG. 16, the generation unit 143 generates an FEC datagram of the jth row, from L media datagrams which belong to the jth row. Further, the generation unit 143 generates an FEC datagram of the kth column, from less than L media datagrams which belong to the kth column. In this way, the generation unit 143 according to the present embodiment generates FEC datagrams, without padding dummy packets for retaining a rectangle. Accordingly, since it may not be necessary to transfer dummy packets, the transmission apparatus 1 according to the present embodiment can prevent a band from becoming wasteful.

Determination Unit 144

The determination unit 144 has a function which determines the transmission order of media datagrams and FEC datagrams. More specifically, the determination unit 144 repeats a determination of a transmission order so as to transmit media datagrams, in order in a horizontal direction (first direction), and next in the order of the FEC datagram generated for the media datagrams which belong to this direction, along a vertical direction (second direction). The determination of a transmission order by the determination unit 144 will be described by referring to FIG. 17 and FIG. 18.

Figure 17:
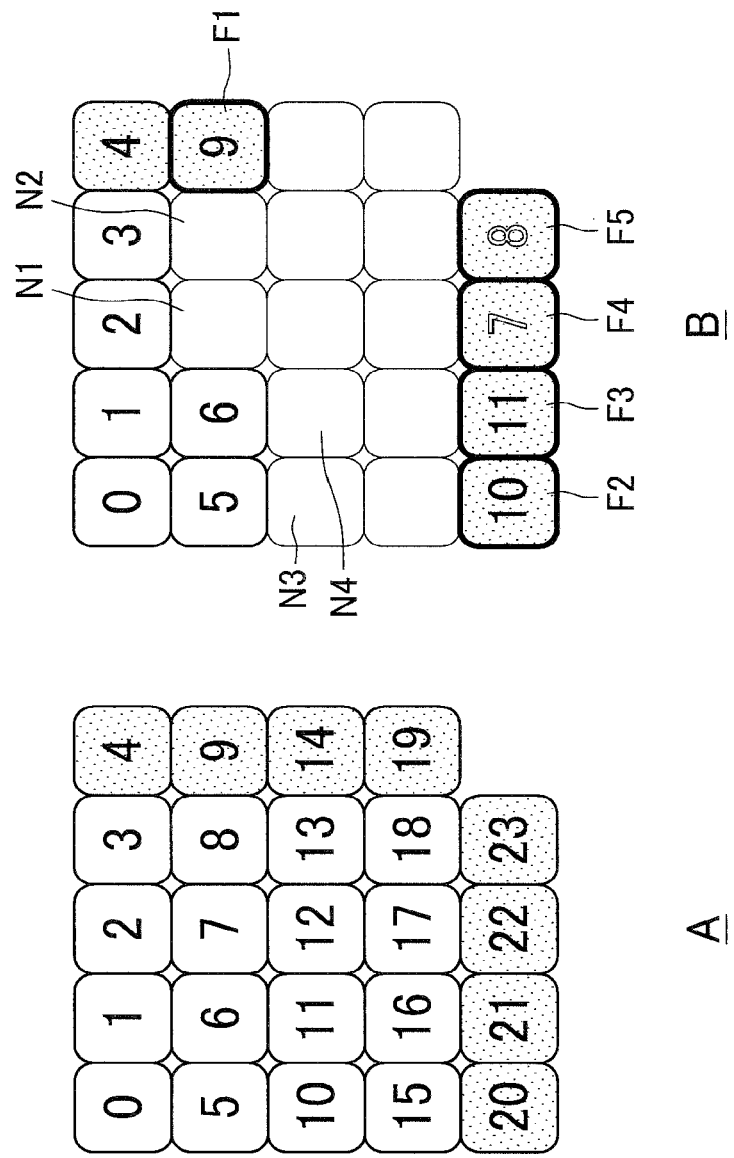
FIG. 17 is a figure for describing the determination of a transmission order by a determination unit according to a first embodiment.

FIG. 17 is a figure for describing the determination of a transmission order by the determination unit 144 according to the first embodiment. FIG. 17 shows a transmission order of the FEC blocks shown in FIG. 15. As shown in FIG. 17A, the determination unit 144 respectively determines number 0, number 1, number 2, and number 3, for the media datagrams of the 0th column, the 2nd column, and the 3rd column of the 0th row, and next determines number 4 for the FEC datagram generated for the media datagrams of the 0th row. The determination unit 144 similarly determines the transmission order for the 1st row to the 4th row.

Here, in the case of a group of pattern 2, media datagrams will often not be present while performing a determination of the transmission order. In the example shown in FIG. 17B, media datagrams are not present after the media datagram of the transmission order 6. In this case, the determination unit 144 determines a transmission order so as to transmit the FEC datagrams for the media datagrams which belong to a vertical direction (second direction), of the positions of media datagrams which are not present. That is, the determination unit 144 determines the transmission order 7, in an FEC datagram F4 of a column unit, of a position N1 of a media datagram which is not present. Next, the determination unit 144 determines the transmission order 8, in an FEC datagram F5 of a column unit, of a position N2 of a media datagram which is not present. Next, the determination unit 144 determines the transmission order 9 in an FEC datagram F1. Next, the determination unit 144 determines the transmission order 10, in an FEC datagram F2 of a column unit, of a position N3 of a media datagram which is not present. Next, the determination unit 144 determines the transmission order 11, in an FEC datagram F2 of a column unit, of a position N4 of a media datagram which is not present.

In this way, the determination unit 144 determines a transmission order for a group of pattern 2. F4 and F5 are received by the reception apparatus 2 prior to the FEC datagrams F1, F2, and F3, by having the determination unit 144 determine the above described transmission order for a group of pattern 2. Accordingly, in the case where media datagrams of the transmission orders 2 and 3 shown in FIG. 17B are lost, for example, the reception apparatus 2 can recover the lost media datagrams by the FEC datagrams F4 and F5, prior to receiving the FEC datagrams F1, F2, and F3.

Moreover, in the case where the media datagram of either of the transmission orders 2 and 3 is lost, the reception apparatus 2 can recover the lost media datagram by an XOR calculation of a horizontal direction, after the FEC datagram reception of the transmission order 4, and prior to the reception of the FEC datagrams F4 and F5.

Figure 18:
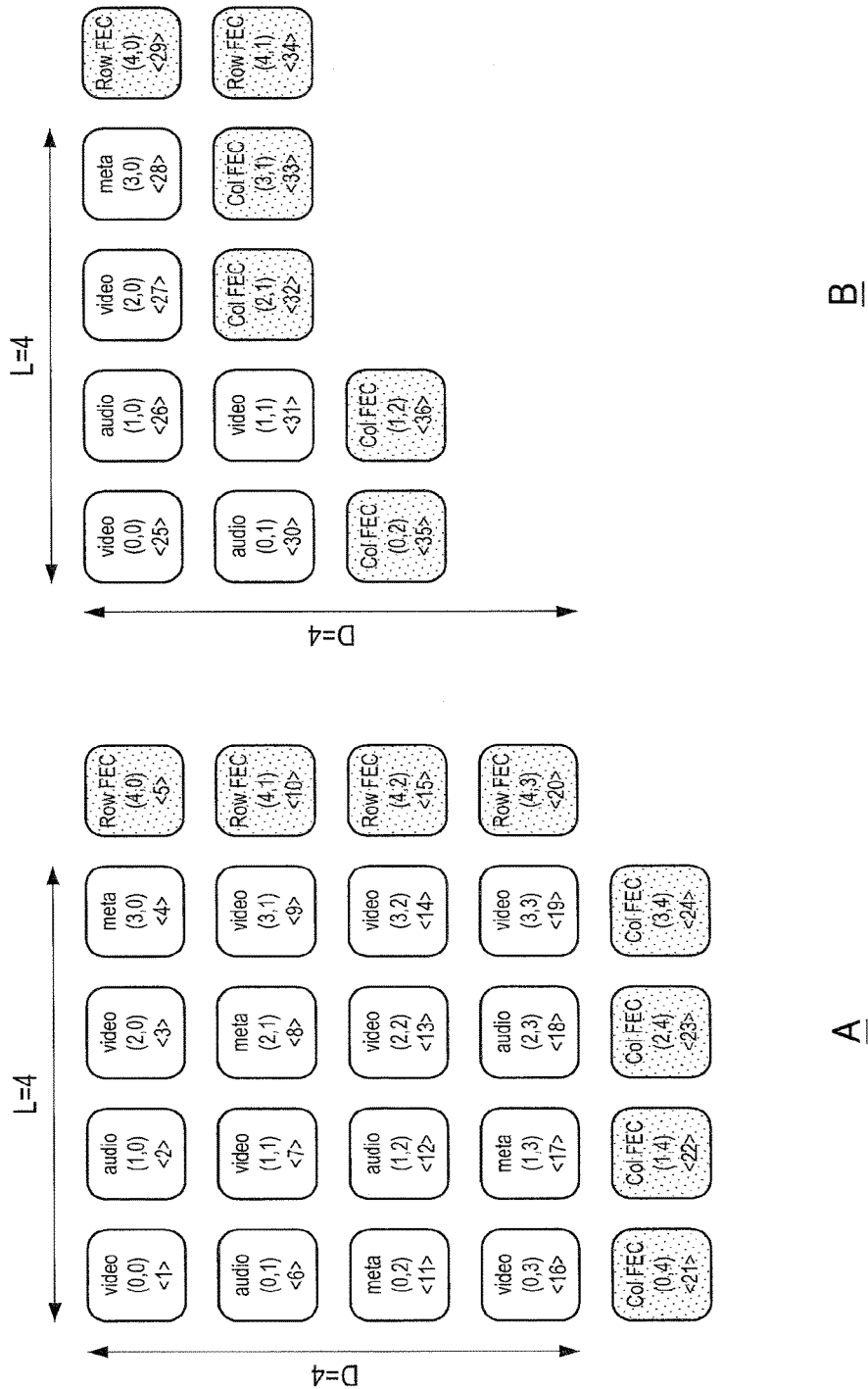
FIG. 18 is a figure which shows an example of a transmission order determined by the determination unit according to a first embodiment.

FIG. 18 is a figure which shows an example of a transmission order determined by the determination unit 144 according to the first embodiment. More specifically, FIG. 18 shows a transmission order of the FEC blocks shown in FIG. 15. The numerals within < > of each media datagram and each FEC datagram show the transmission order determined by the determination unit 144. For example, in the case where the packets of the transmission orders 27 and 28 are lost, the reception apparatus 2 can soon recover the packet of the transmission order 27 after the packet reception of the transmission order 32, and can soon recover the packet of the transmission order 28 after the packet reception of the transmission order 33. Moreover, in the case where the packet of either of the transmission orders 27 and 28 is lost, the reception apparatus 2 can soon recover the lost packet by an XOR calculation of a horizontal direction, after the packet reception of the transmission order 29.

Here, as shown in FIG. 18, in the present embodiment, there will be cases where media datagrams, in which video (video data), audio (audio data), and meta (metadata) are stored, are mixed together within one FEC block. This is because input is performed to the packetizing unit 13 in the order from data for which transmission preparation is completed, and RTP packetizing is performed. That is, in the transfer system according to the present embodiment, it may not be necessary to perform transmission after saving data, for each video, each audio, or each meta. Accordingly, in the transfer system according to the present embodiment, low delay transfer can be achieved.

Further, the determination unit 144 provides LAST flags to the last media datagram in the transmission order, and the FEC datagrams generated for the media datagrams which belong to a vertical direction and a horizontal direction for this media datagram. More specifically, the determination unit 144 provides LAST flags to the media datagram of a break of a frame, and the FEC datagrams of a row unit and a column unit to which this media datagram belongs. The provision of LAST flags by the determination unit 144 will be described by referring to FIG. 19.

Figure 19:
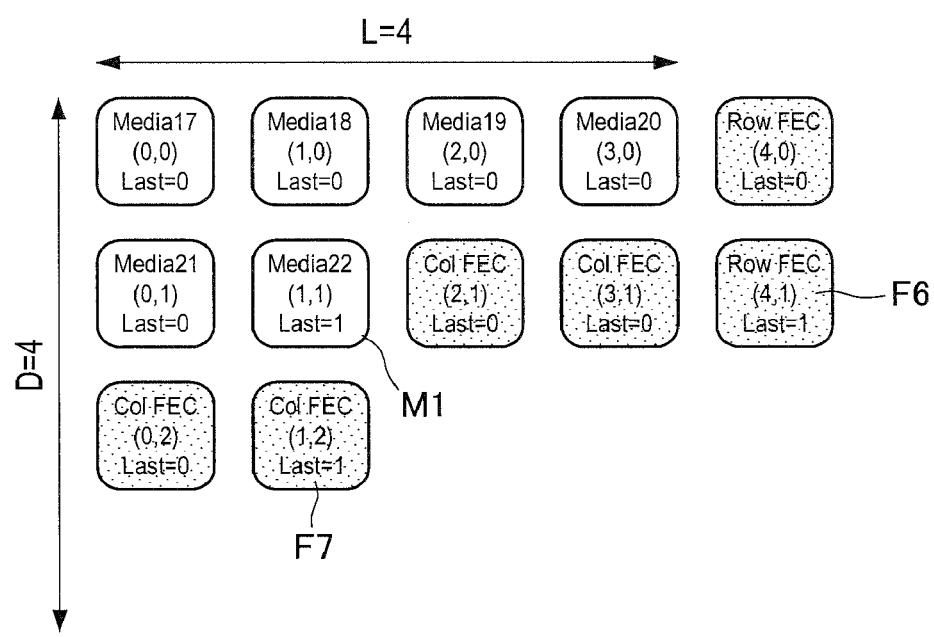
FIG. 19 is a figure for describing the provision of LAST flags by the determination unit according to a first embodiment.

FIG. 19 is a figure for describing the provision of LAST flags by the determination unit 144 according to the first embodiment. As shown in FIG. 19, the determination unit 144 provides a LAST flag to the media datagram M1 of the sequence number 22, in which the transmission order from among the media datagrams becomes the last. Further, the determination unit 144 provides a LAST flag to the FEC datagram F6 of a row unit of the 1st row to which the media datagram M1 belongs, and the FEC datagram F7 of a column unit of the 1st column to which the media datagram M1 belongs. Since frame segmentation can be identified by the LAST flag provided to the media datagram, even without receiving the next FEC block, the reception apparatus 2 can shorten the frame process. Further, since LAST flags are also provided to the FEC datagrams, the reception apparatus 2 can identify frame segmentation by the FEC datagrams to which the LAST flags have been provided, even in the case where the last media datagram is lost.

Heretofore, a configuration of the FEC encoding unit 14 has been described. Hereinafter, a description will be performed for a configuration of the transfer system according to the present embodiment by returning to FIG. 13.

RTP Transmission Unit 15

The RTP transmission unit 15 transmits the RTP packets FEC encoded by the FEC encoding unit 14 to the reception apparatus 2. More specifically, the RTP transmission unit 15 functions as a transmission unit which transmits media datagrams, and FEC datagrams generated by the FEC encoding unit 14, to the reception apparatus 2 in accordance with the transmission order determined by the determination unit 144.

Supplemental Information

In the present embodiment, while a description has been made by setting the first direction to a horizontal direction and the second direction to a vertical direction, the present disclosure is not limit to such an example. For example, the first direction may be set to a vertical direction, and the second direction may be set to a horizontal direction. That is, the arrangement unit 142 may arrange media datagrams in at least a portion of an FEC block, by repeating arrangement of the media datagrams in order along a vertical direction according to a horizontal direction. Also, the determination unit 144 may determine a transmission order, by repeating a determination of a transmission order so as to transmit the media datagrams, in order in a vertical direction, and next in the order of the FEC datagram generated for the media datagrams which belong to this direction, along a horizontal direction. Further, in the case of a group of pattern 2, the determination unit 144 may determine a transmission order so as to transmit an FEC datagram for the media datagrams which belong to a horizontal direction, of the positions of media datagrams which are not present.

(Reception Apparatus 2)

As shown in FIG. 13, the reception apparatus 2 has an RTP reception unit 21, an FEC decoding unit 22, a de-packetizing unit 23, a decoder 24, and an output unit 25.

RTP Reception Unit 21

The RTP reception unit 21 receives RTP packets from the transmission apparatus 1 via the network 3. In the case where there is a packet loss, the RTP reception unit 21 outputs the received RTP packets to the FEC decoding unit 22. On the other hand, in the case where there is no packet loss, the RTP reception unit 21 outputs the received RTP packets to the de-packetizing unit 23.

FEC Decoding Unit 22

The FEC decoding unit 22 is supplied with FEC encoded packets from the RTP reception unit 21, and has a function which performs FEC decoding. Here, an example of decoding of an FEC block of pattern 2 will be described, by referring to FIG. 20.

Figure 20:
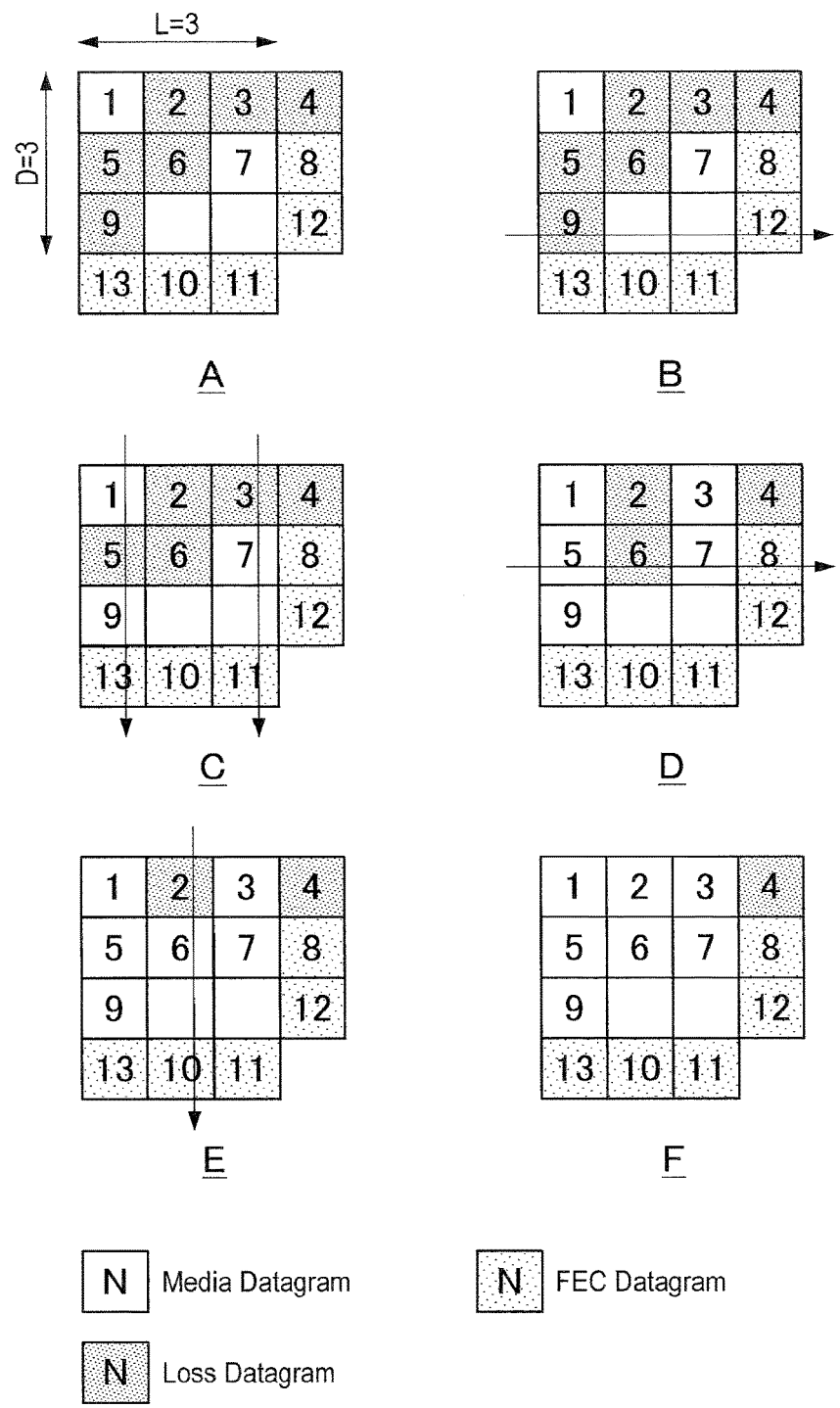
FIG. 20 is a figure for describing FEC decoding by an FEC decoding unit according to a first embodiment.

FIG. 20 is a figure for describing FEC decoding by the FEC decoding unit 22 according to the first embodiment. FIG. 20 shows an example in which the FEC decoding unit 22 decodes an FEC block of pattern 2 with a matrix size of 3×3, and N within the figure shows the transmission order. As shown in FIG. 20A, while the transmission apparatus 1 performs transmission by FEC encoding 7 media datagrams, the media datagrams of the transmission orders 2, 3, 5, 6, and 9, and the FEC datagram of the transmission order 4, are lost.

First, as shown in FIG. 20B, the FEC decoding unit 22 recovers the media datagram of the transmission order 9, by an XOR calculation of the FEC datagram of the transmission order 12. Moreover, since a LAST flag is provided for the media datagram of the transmission order 9 recovered at this time, the reception apparatus 2 can identify a frame segmentation.

Next, as shown in FIG. 20C, the FEC decoding unit 22 recovers the media datagram of the transmission order 5, by an XOR calculation of the media datagrams of the transmission orders 1 and 9, and the FEC datagram of the transmission order 13. Further, the FEC decoding unit 22 recovers the media datagram of the transmission order 3, by an XOR calculation of the media datagram of the transmission order 7, and the FEC datagram of the transmission order 11.

Next, as shown in FIG. 20D, the FEC decoding unit 22 recovers the media datagram of the transmission order 6, by an XOR calculation of the media datagrams of the transmission orders 5 and 7, and the FEC datagram of the transmission order 8.

Next, as shown in FIG. 20E, the FEC decoding unit 22 recovers the media datagram of the transmission order 2, by an XOR calculation of the media datagram of the transmission order 6, and the FEC datagram of the transmission order 10.

By the above described FEC decoding, as shown in FIG. 20F, the FEC decoding unit 22 can recover all of the media datagrams, even if it is an FEC block in which the media datagrams are mostly lost. Further, even in the case where the last media datagram is lost, as shown in FIG. 20B, the reception apparatus 2 can identify a frame segmentation, if the media datagram of the transmission order 9 for which a LAST flag has been provided is capable of being recovered. Accordingly, the reception apparatus 2 can achieve processes of frame units with low delay.

Heretofore, FEC decoding by the FEC decoding unit 22 has been described. Hereinafter, a description will be performed for a configuration of the transfer system according to the present embodiment by returning to FIG. 13.

De-Packetizing Unit 23

The de-packetizing unit 23 de-packetizes the RTP packets supplied from the RTP reception unit 21 or the FEC decoding unit 22. The de-packetizing unit 23 outputs content data to the decoder 24 in the case where the content data is compressed data, and outputs content data to the output unit 25 in the case of non-compression.

Decoder 24

The decoder 24 decodes the compressed data supplied from the de-packetizing unit 23, and outputs it to the output unit 25.

Output Unit 25

The output unit 25 outputs the non-compressed content data of frame units supplied from the de-packetizing unit 23 or the decoder 24 to an output apparatus such as the editing device 200, a display, or a speaker.

(Network 3)

The network 3 is a wired or wireless transfer path of information transmitted from the apparatuses connected to the network 3. The network 3 is constituted by the Internet, a dedicated line, an Internet Protocol-Virtual Private Network (IP-VPN) or the like.

Heretofore, a configuration of the transfer system according to the present embodiment has been described. Further, the operation processes of the transfer system according to the present embodiment will be described, by referring to FIG. 21.

[2-2-3. Operation Processes]

Figure 21:
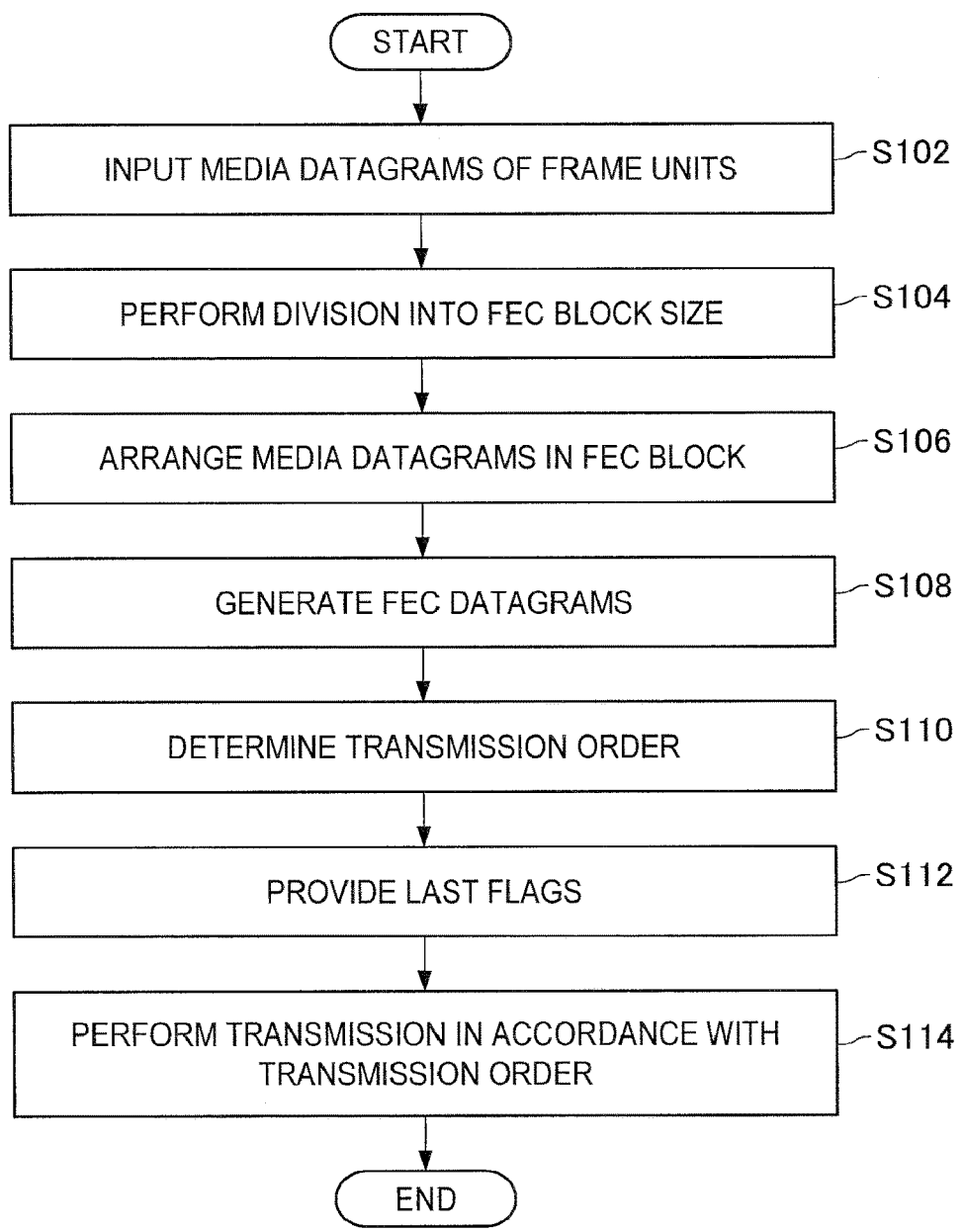
FIG. 21 is a flow chart which shows the operations of a transmission apparatus according to a first embodiment.

FIG. 21 is a flow chart which shows the operations of the transmission apparatus 1 according to the first embodiment. First, in step S102, the transmission apparatus 1 inputs media datagrams of frame units to the FEC encoding unit 14. More specifically, the transmission apparatus 1 outputs media datagrams of frame units to the FEC encoding unit 14, by capturing content data by the capture 11, performing compression encoding by the encoder 12, and performing packetizing by the packetizing unit 13.

Next, in step S104, the division unit 141 divides the input media datagrams of frame units for the number of the matrix size of an FEC block. For example, in the case where FEC encoding of an XOR system is performed by a 4×4 two-dimensional matrix, the division unit 141 divides the input media datagrams of frame units into groups for each of 16 media datagrams.

Next, in step S106, the arrangement unit 142 arranges the media datagrams in an FEC block. More specifically, the arrangement unit 142 arranges the media datagrams of each group divided by the division unit 141 in an FEC block. Here, in the case of a group of pattern 1, the arrangement unit 142 arranges the media datagrams in the number of the matrix size of the FEC block divided by the division unit 141, in the entire FEC block. Further, in the case of a group of pattern 2, the arrangement unit 142 arranges the media datagrams in a number of less than the matrix size of the FEC block divided by the division unit 141, in a portion of the FEC block.

Next, in step S108, the generation unit 143 generates FEC datagrams. More specifically, the generation unit 143 generates an FEC datagram by an XOR calculation, for each of the media datagrams which belong to one row, and for each of the media datagrams which belong to one column, of the matrix arranged by the arrangement unit 142.

Next, in step S110, the determination unit 144 determines a transmission order. More specifically, the determination unit 144 repeats a determination of a transmission order so as to transmit media datagrams, in order in a horizontal direction, and next in the order of the FEC datagram generated for the media datagrams which belong to this direction, along a vertical direction. In this way, the determination unit 144 determines a transmission order of the media datagrams and the FEC datagrams which belong to the FEC block. Further, as described above with reference to FIG. 17B, in the case where media datagrams are not present in pattern 2, the determination unit 144 determines a transmission order so as to transmit FEC datagrams of a column unit, of the positions of the media datagrams which are not present.

Next, in step S112, the determination unit 144 provides LAST flags. More specifically, the determination unit 144 provides LAST flags, to the media datagram of a break of a frame, and the FEC datagrams of a row unit and a column unit to which this media datagram belongs.

Then, in step S114, the RTP transmission unit 15 transmits the RTP packets in accordance with the transmission order. More specifically, the RTP transmission unit 15 transmits the media datagrams, and the FEC datagrams generated by the FEC encoding unit 14, to the reception apparatus 2 in accordance with the transmission order determined by the determination unit 144.

Heretofore, the operation processes of the transmission apparatus 1 according to the present embodiment have been described.

2-3. Second Embodiment

[2-3-1. Outline]

In the present embodiment, transfer with low delay is achieved, by automatically switching the FEC system. First, an outline of the present embodiment will be described, by referring to FIG. 22.

Figure 22:
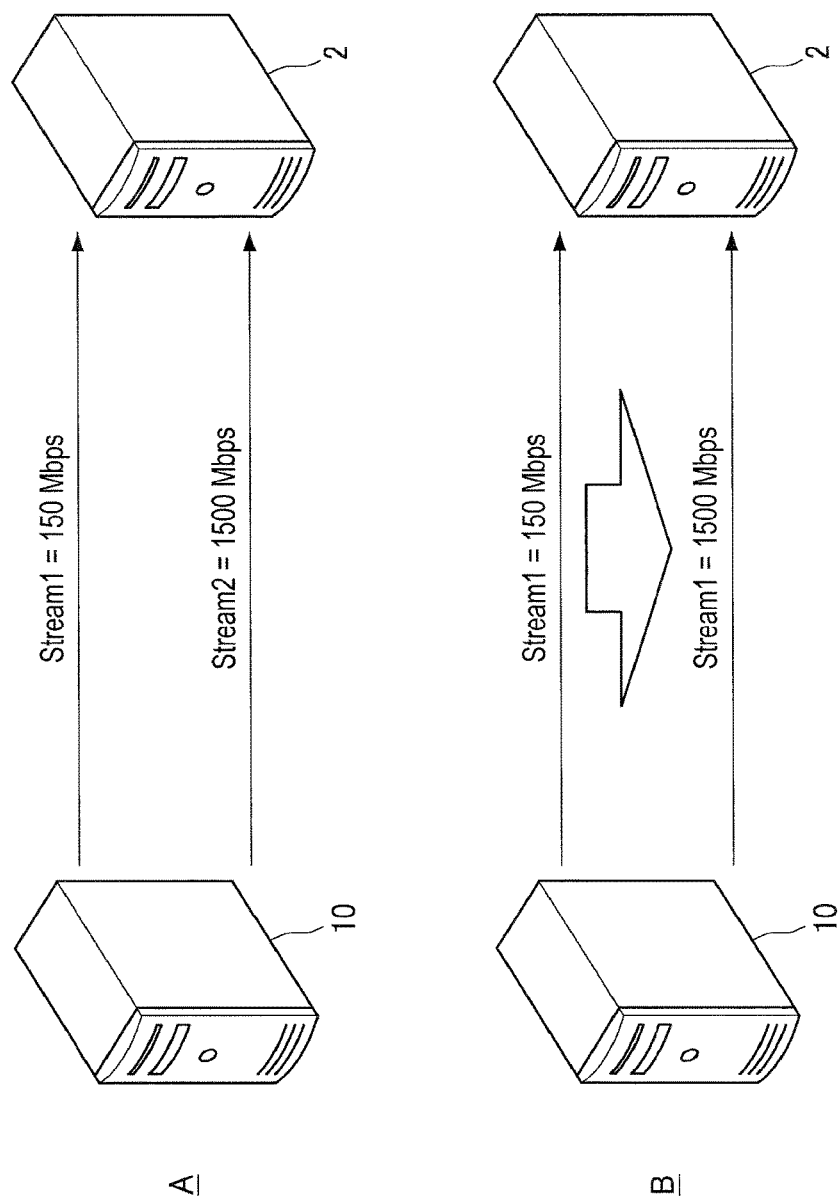
FIG. 22 is a figure for describing an outline of a transfer system according to a second embodiment.

FIG. 22 is a figure for describing an outline of the transfer system according to a second embodiment. The transfer system according to the present embodiment is a system which performs video transfer with a plurality of bit rates such as shown in FIG. 22A, and dynamically changes the bit rate of a video (moving image content) such as shown in FIG. 22B.

Here, a specific example will be described in which video transfer is performed with a plurality of bit rates, by assuming that the transmission apparatus 10 (information processing apparatus) is connected to 10 cameras 100. For example, in the case where 4 out of the 10 are used for a live broadcast, the transmission apparatus 10 transfers video from the 4 with a high bit rate (1.5 Gbps), and since the remaining 6 are used for monitoring, transfer is performed with a compressed low bit rate (150 Mbps).

Similarly, a specific example will be described in which the bit rate of a video is dynamically changed, by assuming that the transmission apparatus 10 is connected to 10 cameras 100. For example, the transmission apparatus 10 performs transfer of only 1 during a live broadcast, from among the 10 cameras 100, with a high bit rate (1.5 Gbps), and since the remaining 9 are for monitoring, transfer is performed with a compressed low bit rate. Also, at the time when the camera 100 during a live broadcast is switched, the transmission apparatus 10 performs a change for the 1 during a live broadcast up until here from a high bit rate to a low bit rate, and performs a change for a new 1 to be during a live broadcast from a low bit rate to a high bit rate.

As described above, there are mainly the two types of an XOR system and an RS code system for an FEC system. Generally, an RS code system has a higher recovery performance in the case of a same redundancy, and a calculation amount is high compared with an XOR system. Here, these FEC systems will be compared in detail, by referring to FIG. 23 and FIG. 24.

FIG. 23 is a table in which the performance of FEC is compared for an XOR system and an RS code system. As shown in FIG. 23, in the case where an FEC block is large (there is a large number of packets), an XOR system can achieve a maximum recovery performance with a low redundancy and low calculation amount. Further, as shown in FIG. 23, in the case where an FEC block is small (there is a small number of packets), an XOR system can achieve a maximum recovery performance with a low redundancy and low calculation amount. In this way, since there are respective advantages and disadvantages for an XOR system and an RS code system, dividing the use corresponding to the condition by the transmission apparatus 10 is requested for low delay transfer achievement.

FIG. 24 is a table which shows the problems of an XOR system and an RS code system. FIG. 24 shows an example in a system for which it may be necessary for FEC delay to have low delay of 1.5 msec or less. As shown in *1 within FIG. 24, in the case of a low bit rate, the redundancy of a ProMPEG system is high, and so waste is produced in the network band. Further, as shown in *2 within FIG. 24, in the case of a high bit rate, the packet density is high, and an RS encoding/decoding process of 80 packets may be necessary within 0.64 msec, and so the specification of necessary hardware becomes extremely high.

In this way, the FEC system suitable for the bit rate will be different, according to the delay time requested for the FEC process. Accordingly, in a system in which there is a plurality of bit rates, there will be cases where problems are produced in the recovery performance, the redundancy, and the processing speed according to the bit rate if the FEC system is not dynamically changed.

Accordingly, in the present embodiment, the transmission apparatus 10 selects the FEC system matching the bit rate at the time of a transmission start, based on a threshold of the bit rate. In addition, in the case where the bit rate is changed during transmission, the transmission apparatus 10 automatically changes the FEC system based on a comparison result between the bit rate after being changed and a threshold.

Further, the suitable FEC system will be different, according to the size of data to be transmitted. More specifically, the suitable FEC system will be different, according to whether a video to be transmitted is not compressed (RAW data), or whether it is a compressed video. Accordingly, in a system where the size of a video to be transmitted is different, there will be cases where problems are produced in the recovery performance, the redundancy, and the processing speed according to compression/non-compression of a video if the FEC system is not dynamically changed.

Accordingly, in the present embodiment, the transmission apparatus 10 selects the FEC system matching compression/non-compression at the time of a transmission start, based on compression/non-compression of a video to be transmitted. Further, in the case where compression/non-compression is changed during transmission, the transmission apparatus 10 automatically changes the FEC system based on compression/non-compression after being changed.

Moreover, in the case where the FEC system is switched, the transmission apparatus 10 enables decoding by the reception apparatus 2, by notifying information, which shows that there has been switching, to the reception apparatus 2. For example, the transmission apparatus 10 notifies information, which shows the timing at which the FEC system is switched, the FEC system after being switched or the like, to the reception apparatus 2, by providing to a header or transmitting a dedicated message.

Heretofore, an outline of the present embodiment has been described. Further, a configuration of the transfer system according to the present embodiment will be described, by referring to FIG. 25.

[2-3-2. Configuration]

Figure 25:
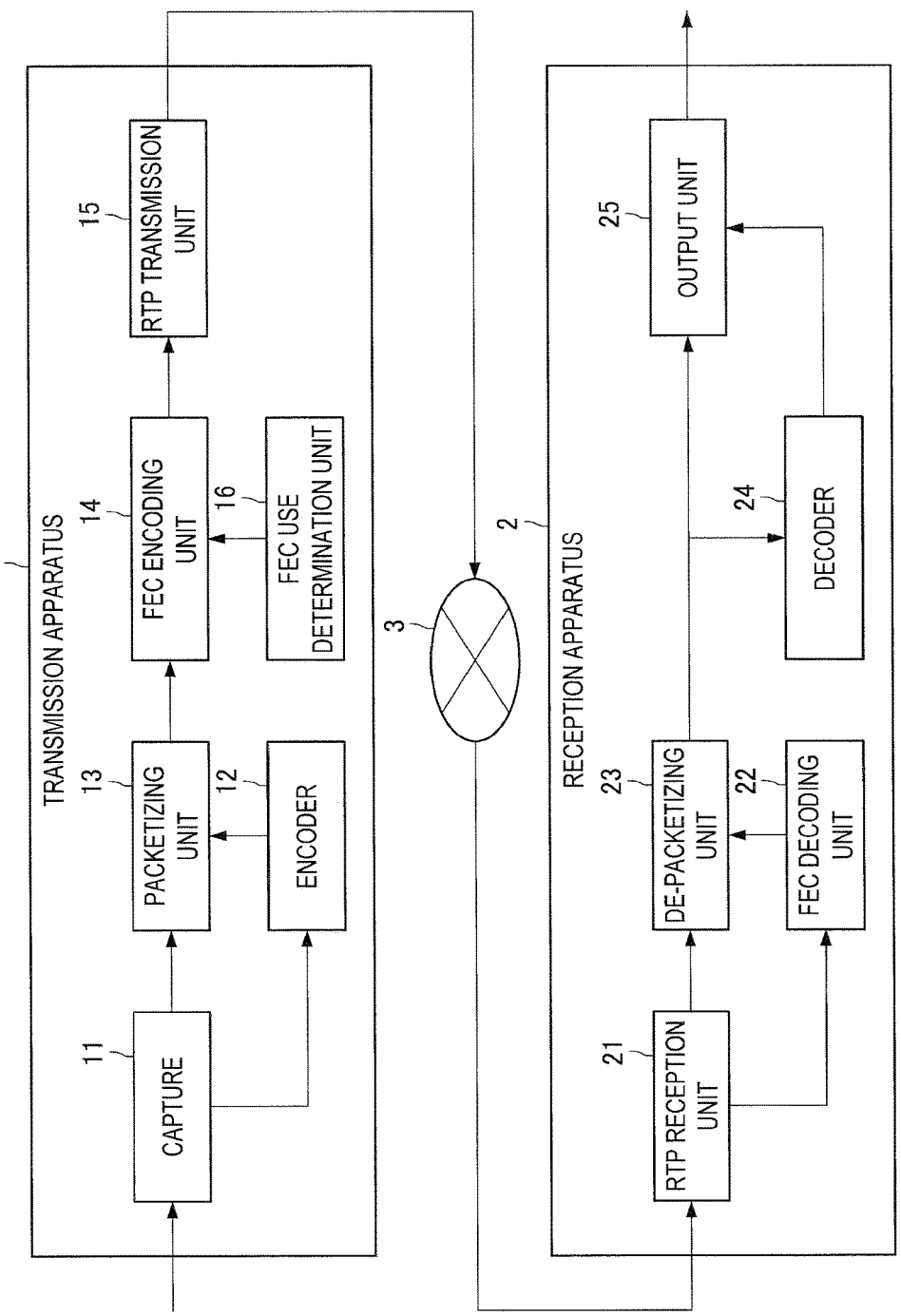
FIG. 25 is a block diagram which shows a configuration of a transfer system according to a second embodiment.

FIG. 25 is a block diagram which shows a configuration of the transfer system according to the second embodiment. As shown in FIG. 25, the transmission apparatus 10 and the reception apparatus 2 are connected by the network 3. Since the configurations of the reception apparatus 2 and the network 3 are as described in the first embodiment, a detailed description of them will be omitted here. Hereinafter, a configuration of the transmission apparatus 10 will be described.

(Transmission Apparatus 10)

As shown in FIG. 13, the transmission apparatus 10 has a capture 11, an encoder 12, a packetizing unit 13, an FEC encoding unit (encoding unit) 14, an RTP transmission unit 15, and an FEC use determination unit 16. Since the capture 11, the encoder 12, the packetizing unit 13, the FEC encoding unit 14, and the RTP transmission unit 15 are as described in the first embodiment, a detailed description of them will be omitted here.

FEC use Determination Unit 16

The FEC use determination unit 16 has a function which determines an FEC encoding system in the FEC encoding unit 14. That is, the FEC encoding unit 14 FEC encodes media datagrams (transmission data) by the encoding system determined by the FEC use determination unit 16. Also, the RTP transmission unit 15 transmits the transmission data FEC encoded by the encoding system determined by the FEC use determination unit 16 to the reception apparatus 2. Here, a detailed configuration of the FEC use determination unit 16 will be described, by referring to FIG. 26.

Figure 26:
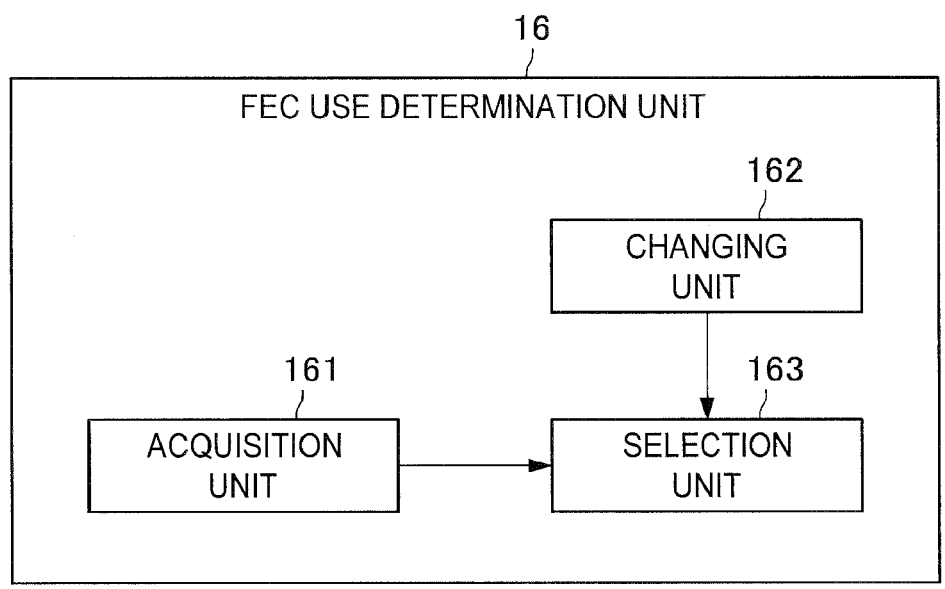
FIG. 26 is a block diagram which shows a configuration of an FEC use determination unit according to a second embodiment.

FIG. 26 is a block diagram which shows a configuration of the FEC use determination unit 16 according to the second embodiment. As shown in FIG. 26, the FEC use determination unit 16 functions as an acquisition unit 161, a changing unit 162, and a selection unit 163.

Acquisition Unit 161

The acquisition unit 161 has a function which acquires a transfer bit rate. The acquisition unit 161 acquires a transfer bit rate, for example, by monitoring the state of the network 3.

Changing Unit 162

The changing unit 162 has a function which changes the transfer bit rate. The changing unit 162 changes the transfer bit rate, for example, based on a user instruction, an instruction from an external unit or the like.

Selection Unit 163

The selection unit 163 has a function which selects an FEC encoding system (an encoding system such as forward error correction), based on a comparison result between the transfer bit rate acquired by the acquisition unit 161 and a threshold. Specifically, the selection unit 163 selects either of an RS code system and an XOR system, as the FEC encoding system. More specifically, the selection unit 163 selects an RS code system in the case where the transfer bit rate is lower than the threshold, and selects an XOR system in the case where the transfer bit rate is higher than the threshold. For example, in the example shown in FIG. 22A, in the case where the threshold is set to 500 Mbps, the selection unit 163 selects an RS code system in the case where the transfer bit rate is 150 Mbps, and selects an XOR system in the case where the transfer bit rate is 1500 Mbps. In this way, by dynamically selecting an FEC system suitable for the transfer bit rate of the network 3 by the selection unit 163, the transmission apparatus 10 can achieve transfer with low delay.

Further, the selection unit 163 has a function which selects an FEC encoding system, based on a comparison result between the transfer bit rate changed by the changing unit 162 and a threshold. More specifically, the selection unit 163 selects an RS code system in the case where the transfer bit rate after being changed is lower than the threshold, and selects an XOR system in the case where the transfer bit rate is higher than the threshold. For example, in the example shown in FIG. 22B, in the case where the threshold is set to 500 Mbps, the selection unit 163 selects an XOR system in the case where the transfer bit rate after being changed is 1500 Mbps. Similarly, the selection unit 163 selects an RS code system in the case where the transfer bit rate after being changed is 150 Mbps. In this way, by dynamically selecting an FEC system suitable for the transfer bit rate dynamically changed by the changing unit 162 by the selection unit 163, the transmission apparatus 10 can achieve transfer with low delay.

In addition, the selection unit 163 has a function which selects an FEC encoding system, based on whether or not moving image content to be transmitted is compressed.

More specifically, the selection unit 163 selects an RS code system in the case where a video input to the FEC encoding unit 14 is compressed by the encoder 12, and selects an XOR system in the case of non-compression (RAW data). In this way, by dynamically selecting an FEC system suitable for compression/non-compression of a video to be transmitted by the selection unit 163, the transmission apparatus 10 can achieve transfer with low delay.

Heretofore, a configuration of the transfer system according to the present embodiment has been described. Further, the operation processes of the transfer system according to the present embodiment will be described, by referring to FIG. 27.

[2-3-3. Operation Processes]

Figure 27:
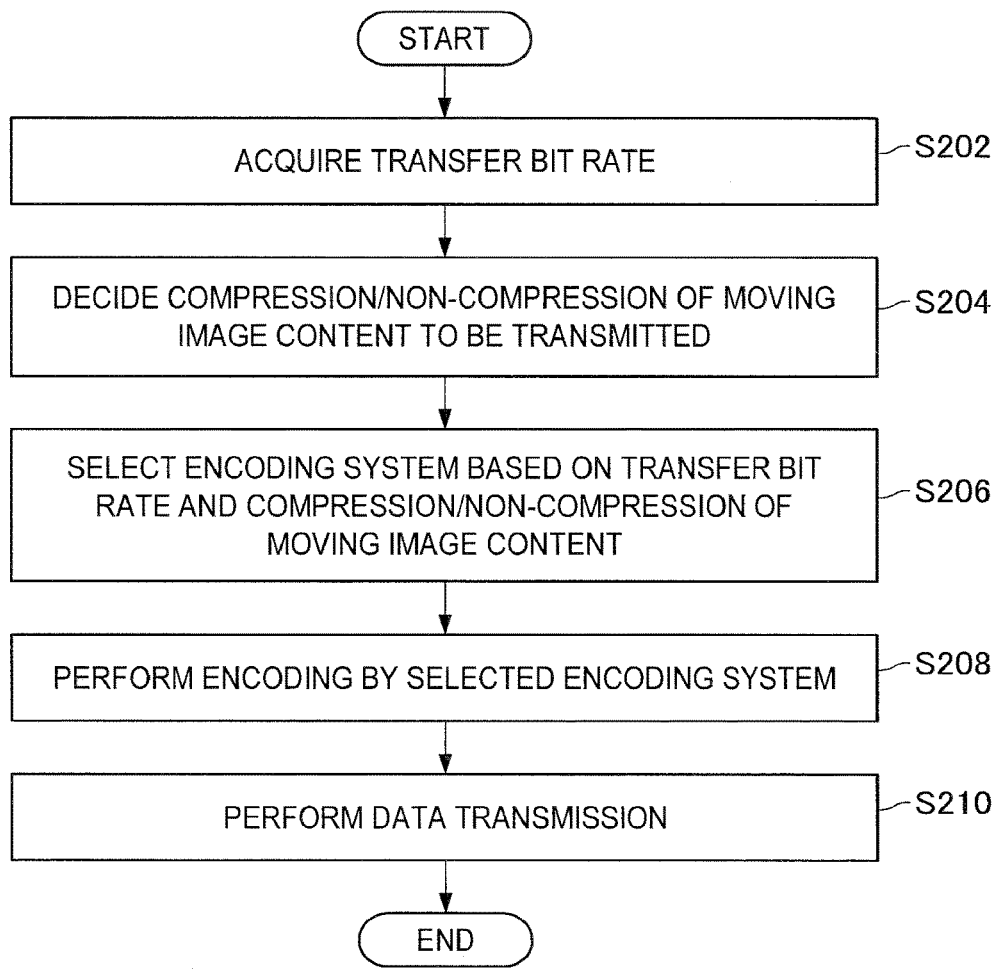
FIG. 27 is a flow chart which shows the operations of a transmission apparatus according to a second embodiment.

FIG. 27 is a flow chart which shows the operations of the transmission apparatus 10 according to the second embodiment. First, in step S202, the acquisition unit 161 acquires a transfer bit rate.

Next, in step S204, the selection unit 163 decides compression/non-compression of moving image content to be transmitted. Specifically, the selection unit 163 decides whether a video to be transmitted is RAW data, or whether it is a compressed video.

Next, in step S206, the selection unit 163 selects an encoding system based on the transfer bit rate and compression/non-compression of the moving image content. More specifically, the selection unit 163 selects an RS code system in the case where the transfer bit rate acquired by the acquisition unit 161 is lower than a threshold, and selects an XOR system in the case where the transfer bit rate is higher than a threshold. Here, in the case where the transfer bit rate has been changed by the changing unit 162, the selection unit 163 selects an RS code system in the case where the transfer bit rate after being changed is lower than a threshold, and selects an XOR system in the case where the transfer bit rate is higher than a threshold. Further, the selection unit 163 selects an RS code system in the case where the moving image content to be transmitted is compressed by the encoder 12, and selects an XOR system in the case of non-compression.

Next, in step S208, the FEC encoding unit 14 encodes media datagrams by the encoding system determined by the FEC use determination unit 16. More specifically, the FEC encoding unit 14 FEC encodes media datagrams by the encoding system of either of an XOR system and an RS code system selected by the selection unit 163.

Then, in step S210, the RTP transmission unit 15 transmits the media datagrams and the FEC datagrams output from the FEC encoding unit 14 to the reception apparatus 2.

Heretofore, the operation processes of the transmission apparatus 10 according to the present embodiment have been described.

3. Summary

As described above, according to the present disclosure, it is possible to improve technology related to FEC for achieving low delay transfer. More specifically, the transfer system according to the first embodiment can achieve data transfer with low delay, by an FEC system based on frame breaks of a Video. Further, the transfer system according to the second embodiment can achieve data transfer with low delay, by automatically switching an FEC system.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, a computer program for causing hardware such as a CPU, ROM, and RAM built into an information processing apparatus to exhibit functions the same as each of the configurations of the above described transmission apparatus 1, transmission apparatus 10, and reception apparatus 2 can be created. Further, a recording medium for recording this computer program is also provided.

Additionally, the present technology may also be configured as below.

(1)

An information processing apparatus including:
  an arrangement unit configured to arrange datagrams in a number of a predetermined matrix size or less in at least a portion of the matrix of the predetermined size, by repeating arrangement of the datagrams in order along a first direction according to a second direction; and
  a generation unit configured to generate a redundant datagram for forward error correction for each of the datagrams belonging to one row, and for each of the datagrams belonging to one column of the matrix arranged by the arrangement unit.

(2)

The information processing apparatus according to (1), further including:
  a determination unit configured to determine a transmission order of the datagrams and the redundant datagram,
  wherein the determination unit repeats, along the second direction, a determination of a transmission order so as to transmit the datagrams, in an order of the first direction, and next in an order of the redundant datagram for datagrams belonging to the first direction.

(3)

The information processing apparatus according to (2), wherein, in a case where the datagram is not present, the determination unit determines a transmission order so as to transmit the redundant datagram for the datagrams belonging to the second direction in a position of the datagram that is not present.

(4)

The information processing apparatus according to (2) or (3),
  wherein the determination unit provides a predetermined flag to a last datagram in the transmission order from among the datagrams, and to the redundant datagrams for the datagrams belonging to the first direction and the second direction of the last datagram (5)

The information processing apparatus according to any one of (2) to (4), further including:
  a transmission unit configured to transmit the datagrams and the redundant datagram in accordance with the transmission order determined by the determination unit.

(6)

The information processing apparatus according to any one of (1) to (5), further including:
  an input unit configured to input the datagrams constituting moving image content of frame units; and
  a division unit configured to divide the datagrams of frame units input to the input unit by number of the predetermined matrix size, wherein the arrangement unit arranges datagrams in the number of the predetermined matrix size divided by the division unit, or datagrams in a number of less than the predetermined matrix size.

(7)

The information processing apparatus according to any one of (1) to (6),
wherein the generation unit generates the redundant datagram by an exclusive OR of the datagrams belonging to one row or column.

(8)

The information processing apparatus according to any one of (1) to (7),
wherein the first direction and the second direction are at least either of a horizontal direction and a vertical direction, and the vertical direction and the horizontal direction.

(9)

The information processing apparatus according to any one of (1) to (8),
wherein the datagram is at least one of video data, audio data, and metadata constituting moving image content.

(10)

An information processing method including:
arranging datagrams in a number of a predetermined matrix size or less in at least a portion of the matrix of the predetermined size, by repeating arrangement of the datagrams in order along a first direction according to a second direction; and
generating a redundant datagram for forward error correction for each of the datagrams belonging to one row, and for each of the datagrams belonging to one column of the arranged matrix.

(11)

A program for causing a computer to function as:
an arrangement unit configured to arrange datagrams in a number of a predetermined matrix size or less in at least a portion of the matrix of the predetermined size, by repeating arrangement of the datagrams in order along a first direction according to a second direction; and
a generation unit configured to generate a redundant datagram for forward error correction for each of the datagrams belonging to one row, and for each of the datagrams belonging to one column of the matrix arranged by the arrangement unit.

REFERENCE SYMBOLS LIST 1, 10 transmission apparatus
11 capture
12 encoder
13 packetizing unit
14 FEC encoding unit
141 division unit
142 arrangement unit
143 generation unit
144 determination unit
15 RTP transmission unit
16 FEC use determination unit
161 acquisition unit
162 changing unit
163 selection unit
2 reception apparatus
21 RTP reception unit
22 FEC decoding unit
23 de-packetizing unit
24 decoder
25 output unit
3 network
100 camera
200 editing device

The invention claimed is:

1. An information processing apparatus comprising:
circuitry configured to:
arrange a first number of datagrams in a portion of a matrix of a predetermined size, the first number of datagrams being less than a value defined by a total number of rows of the matrix and a total number of columns of the matrix,
generate a redundant datagram for forward error correction for each of the datagrams belonging to one row of the matrix and for each of the datagrams belonging to one column of the matrix,
determine a transmission order of the datagrams and the redundant datagrams so as to transmit datagrams belonging to a first direction in order along the first direction and thereafter transmit a redundant datagram for the datagrams belonging to the first direction,
provide a predetermined flag to at least one of a last datagram in the transmission order, a redundant datagram for datagrams belonging to the first direction of the last datagram, and a redundant datagram for datagrams belonging to a second direction of the last datagram, and
transmit the datagrams and the redundant datagrams for reproduction of moving image content of the datagrams to a reception apparatus according to the transmission order.

2. The information processing apparatus according to claim 1, wherein, in response to a datagram not being present in the first direction, the circuitry is further configured to determine the transmission order so as to transmit a redundant datagram, for a datagram belonging to a second direction in a position of the datagram that is not present, before the redundant datagram for the datagrams belonging to the first direction.

3. The information processing apparatus according to claim 1, wherein the circuitry is further configured to transmit the datagrams and the redundant datagrams in accordance with the transmission order.

4. The information processing apparatus according to claim 1, wherein the circuitry is further configured to
input a second number of datagrams that is greater than the value and includes the first number of datagrams,
divide the second number of datagrams corresponding to the value, and
arrange the second number of datagrams in another matrix of the predetermined size and the portion of the matrix of the predetermined size.

5. The information processing apparatus according to claim 1, wherein the circuitry is further configured to generate the redundant datagrams by an exclusive OR of the datagrams belonging to the one row or the one column.

6. The information processing apparatus according to claim 1, wherein the first direction is either of a horizontal direction and a vertical direction.

7. The information processing apparatus according to claim 1, wherein each of the datagrams is at least one of video data, audio data, and metadata constituting the moving image content.

8. An information processing method comprising:
arranging datagrams in a portion of a matrix of a predetermined size, a number of the datagrams being less than a value defined by a total number of rows of the matrix and a total number of columns of the matrix;
generating a redundant datagram for forward error correction for each of the datagrams belonging to one row of the matrix and for each of the datagrams belonging to one column of the matrix;
determining a transmission order of the datagrams and the redundant datagrams so as to transmit datagrams belonging to a first direction in order along the first direction and thereafter transmit a redundant datagram for the datagrams belonging to the first direction;
providing a predetermined flag to at least one of a last datagram in the transmission order, a redundant datagram for datagrams belonging to the first direction of the last datagram, and a redundant datagram for datagrams belonging to a second direction of the last datagram; and
transmitting the datagrams and the redundant datagrams for reproduction of moving image content of the datagrams to a reception apparatus according to the transmission order.

9. A non-transitory computer-readable medium including instructions, that when executed by at least one processor, cause the at least one processor to perform a method, the method comprising:

arranging datagrams in a portion of a matrix of a predetermined size, a number of the datagrams being less than a value defined by a total number of rows of the matrix and a total number of columns of the matrix;
generating a redundant datagram for forward error correction for each of the datagrams belonging to one row of the matrix and for each of the datagrams belonging to one column of the matrix;
determining a transmission order of the datagrams and the redundant datagrams so as to transmit datagrams belonging to a first direction in order along the first direction and thereafter transmit a redundant datagram for the datagrams belonging to the first direction;
providing a predetermined flag to at least one of a last datagram in the transmission order, a redundant datagram for datagrams belonging to the first direction of the last datagram, and a redundant datagram for datagrams belonging to a second direction of the last datagram; and
transmitting the datagrams and the redundant datagrams for reproduction of moving image content of the datagrams to a reception apparatus according to the transmission order.

* * * * *